US011843256B2

(12) United States Patent
Kim et al.

(10) Patent No.: US 11,843,256 B2
(45) Date of Patent: Dec. 12, 2023

(54) WIRELESS POWER TRANSMISSION APPARATUS

(71) Applicant: Samsung Electronics Co., Ltd., Suwon-si (KR)

(72) Inventors: Yusu Kim, Suwon-si (KR); Dohyeon Kim, Suwon-si (KR); Byunghwa Park, Suwon-si (KR); Seho Park, Suwon-si (KR); Wooram Lee, Suwon-si (KR); Hyungkoo Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/867,016

(22) Filed: Jul. 18, 2022

(65) Prior Publication Data

US 2023/0124638 A1    Apr. 20, 2023

(30) Foreign Application Priority Data

Oct. 20, 2021    (KR) .................. 10-2021-0140097

(51) Int. Cl.
*H02J 50/10* (2016.01)
*H01F 27/40* (2006.01)
*H05K 1/18* (2006.01)

(52) U.S. Cl.
CPC ............ *H02J 50/10* (2016.02); *H01F 27/402* (2013.01); *H05K 1/189* (2013.01); *H01F 2027/406* (2013.01); *H05K 2201/10151* (2013.01)

(58) Field of Classification Search
CPC .. H02J 50/10; H01F 27/402; H01F 2027/406; H05K 1/189; H05K 2201/10151

USPC ......................................................... 307/104
See application file for complete search history.

(56) References Cited

U.S. PATENT DOCUMENTS

| 8,089,245 | B2 | 1/2012 | Kato et al. |
| 10,158,261 | B2 | 12/2018 | Jang et al. |
| 10,680,470 | B2 | 6/2020 | Jang et al. |
| 2008/0164839 | A1* | 7/2008 | Kato .................. H02J 7/04 320/108 |
| 2008/0164840 | A1* | 7/2008 | Kato .................. H02J 50/70 336/200 |

(Continued)

FOREIGN PATENT DOCUMENTS

| JP | 2014-093921 A | 5/2014 |
| JP | 2016-007100 A | 1/2016 |

*Primary Examiner* — Alfonso Perez Borroto
(74) *Attorney, Agent, or Firm* — Jefferson IP Law, LLP

(57) ABSTRACT

A wireless power transmission apparatus is provided. The wireless power transmission apparatus includes an upper housing, a lower housing coupled to the upper housing, a substrate disposed between the upper housing and the lower housing, a transmit coil disposed between the upper housing and the substrate and formed by being wound in the form of rotating on the substrate, at least one temperature sensor including a pattern resistor, a resistance numerical value which varies with temperature, and a flexible printed circuit board (FPCB) on which the at least one temperature sensor is disposed. The pattern resistor is disposed on the FPCB in a pattern of being wound in a first direction from any first point on the FPCB to any second point different from the any first point on the FPCB around a central portion of the FPCB and being rewound in a second direction opposite to the first direction.

20 Claims, 20 Drawing Sheets

(56) References Cited

U.S. PATENT DOCUMENTS

| | | | |
|---|---|---|---|
| 2009/0278523 A1* | 11/2009 | Yoda | H02J 50/10 |
| | | | 307/104 |
| 2017/0047791 A1 | 2/2017 | Jang et al. | |
| 2018/0048191 A1* | 2/2018 | Uramoto | H02J 50/40 |
| 2019/0123599 A1 | 4/2019 | Jang et al. | |

* cited by examiner

WIRELESS POWER TRANSMISSION APPARATUS

CROSS-REFERENCE TO RELATED APPLICATION(S)

This application is based on and claims priority under 35 U.S.C. § 119(a) of a Korean patent application number 10-2021-0140097, filed on Oct. 20, 2021, in the Korean Intellectual Property Office, the disclosure of which is incorporated by reference herein in its entirety.

BACKGROUND

1. Field

The disclosure relates to a position where a temperature sensor is mounted in a wireless power transmission apparatus and an operation method of the wireless power transmission apparatus and a wireless power reception apparatus.

2. Description of Related Art

Wireless charging refers to a scheme for wirelessly transmitting power through the atmosphere to charge a device, rather than a scheme for transmitting power using wires to charge the device. The basic principle of wireless charging is to rectify an Alternating Current (AC) current to charge the battery, when a magnetic field is formed around a transmit coil when flowing the AC current in the transmit coil and when the AC current flows in the coil of the receiver due to the influence of the magnetic field. A device which supplies power to a wireless power reception apparatus using a wireless charging scheme is referred to as a wireless power transmission apparatus.

The wireless power transmission apparatus supplies power without a contact terminal to provide convenience of use. However, when metal foreign substances are present on the wireless power transmission apparatus during wireless charging, there may be problems in which power loss occurs or the wireless power transmission apparatus or the wireless power reception apparatus is damaged due to heat generated by an eddy current generated by the metal foreign substances. When a user is in contact with the metal foreign substances, there may be a possibility of the user being burned. Thus, a temperature sensor may be mounted on the wireless power transmission apparatus to detect metal foreign substances attached to the wireless power transmission apparatus.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a wireless power transmission apparatus for mounting a temperature sensor to detect foreign substances present on a wireless power transmission apparatus during wireless charging and prevent power loss, the damage of an electronic device due to heat, and user injury and improving power transmission efficiency.

Additional aspects will be set forth in part in the description which follows and, in part, will be apparent from the description, or may be learned by practice of the presented embodiments.

In accordance with an aspect of the disclosure, a wireless power transmission apparatus is provided. The wireless power transmission apparatus includes an upper housing, a lower housing coupled to the upper housing, a substrate disposed between the upper housing and the lower housing, a transmit coil disposed between the upper housing and the substrate and formed by being wound in the form of rotating on the substrate, at least one temperature sensor including a pattern resistor, a resistance numerical value of which varies with a temperature, and a flexible printed circuit board (FPCB) on which the at least one temperature sensor is disposed. The pattern resistor may be disposed on the FPCB in a pattern of being wound in a first direction from any first point on the FPCB to any second point different from the any first point on the FPCB around a central portion of the FPCB and being rewound in a second direction opposite to the first direction.

In accordance with another aspect of the disclosure, a wireless power transmission apparatus is provided. The wireless power transmission apparatus includes an upper housing, a lower housing coupled to the upper housing, a substrate disposed between the upper housing and the lower housing, a transmit coil disposed between the upper housing and the substrate and formed by being wound in the form of rotating on the substrate, at least one temperature sensor corresponding to any one of a negative temperature coefficient (NTC) thermistor, a positive temperature coefficient (PTC) thermistor, and a thermocouple, at least one wiring conductor connected with the at least one temperature sensor, ground wiring connected with the at least one temperature sensor to ground the at least one temperature sensor, and a flexible printed circuit board (FPCB) on which the at least one temperature sensor, the at least one wiring conductor, and the ground wiring are arranged. The at least one wiring conductor may be disposed on the FPCB in a pattern of being wound in a first direction from any point on the FPCB to a point where the at least one temperature sensor is located around a central portion of the FPCB and being connected with the at least one temperature sensor. The ground wiring may be disposed on the FPCB in a pattern of being rewound in a second direction opposite to the first direction around the central portion of the FPCB from a point connected with the at least one temperature sensor on the FPCB.

In accordance with another aspect of the disclosure, a wireless power transmission apparatus is provided. The wireless power transmission apparatus includes an upper housing, a lower housing coupled to the upper housing, a substrate disposed between the upper housing and the lower housing, a transmit coil disposed between the upper housing and the substrate and formed by being wound in the form of rotating on the substrate, at least one temperature sensor configured to correspond to any one of a wire type negative temperature coefficient (NTC) thermistor, a wire type positive temperature coefficient (PTC) thermistor, and a wire type thermocouple, include a temperature sensing unit and a wire connected with the temperature sensing unit, and be disposed on the transmit coil, and ground wiring disposed on the transmit coil, wound from any point on the transmit coil to the point where the temperature sensing unit of the at least one temperature sensor is located around a central portion of the transmit coil, and connected with the temperature sensing unit to ground the temperature sensing unit. The wire of the at least one temperature sensor may be disposed on the transmit coil in a pattern of being wound from the any point on the transmit coil to the point where the temperature sensing unit of the at least one temperature sensor is located around the central portion of the transmit coil and being connected with the temperature sensing unit.

According to embodiments disclosed in the disclosure, heat generated by metal foreign substances on the wireless power transmission apparatus may be effectively detected to block transmission of wireless power, thus preventing power loss, the damage of the wireless power transmission apparatus and the wireless power reception apparatus, and user injury.

Furthermore, according to embodiments disclosed in the disclosure, power transmission efficiency may be improved during wireless charging.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, a description will be given of a wireless charging system between a wireless power transmission apparatus and a wireless power reception apparatus with reference to FIGS. 1, 2, and 3.

Figure 1:
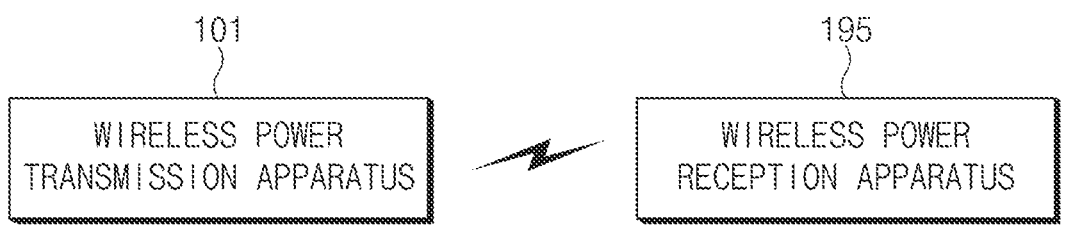
FIG. 1 is a block diagram of a wireless power transmission apparatus and a wireless power reception apparatus according to an embodiment of the disclosure.

FIG. 1 is a block diagram of a wireless power transmission apparatus and a wireless power reception apparatus according to an embodiment of the disclosure.

Referring to FIG. 1, a wireless power transmission apparatus 101 may wirelessly transmit power to a wireless power reception apparatus 195. According to an embodiment, the wireless power transmission apparatus 101 may transmit power depending on an induction scheme. When the wireless power transmission apparatus 101 is based on the induction scheme, it may include, for example, a power source, a Direct Current-Alternating Current (DC-AC) conversion circuit, an amplification circuit, an impedance matching circuit, at least one capacitor, at least one coil, and/or a communication modulation and demodulation circuit. The at least one capacitor may make up a resonant circuit together with the at least one coil. The wireless power transmission apparatus 101 may be implemented in a scheme defined in the wireless power consortium (WPC) standard (or the Qi standard). For another example, the wireless power transmission apparatus 101 may transmit power depending on a resonant scheme. When the wireless power transmission apparatus 101 is based on the resonant scheme, it may include, for example, a power source, a DC-AC conversion circuit, an amplification circuit, an impedance matching circuit, at least one capacitor, at least one coil, and/or an out-of-band communication circuit (e.g., a Bluetooth low energy (BLE) communication circuit). The at least one capacitor and the at least one coil may make up a resonant circuit. The wireless power transmission apparatus 101 may be implemented in a scheme defined in the alliance for wireless power (A4WP) standard (or the air fuel alliance (AFA) standard). The wireless power transmission apparatus 101 may include a coil which may generate an induced magnetic field when current flows according to the resonant scheme or the induction scheme. The process where the wireless power transmission apparatus 101 generates the induced magnetic field may be expressed that the wireless power transmission apparatus 101 wirelessly transmit power. In addition, the wireless power reception apparatus 195 may include a coil which generates an induced electromotive force by means of a magnetic field, the magnitude of which is changed over time, which is formed around. The process of generating the induced electromotive force by means of the coil may be expressed that the wireless power reception apparatus 195 wirelessly receives power. For example, the wireless power transmission apparatus 101 may implement a standard for wireless power transmission as a scheme defined in the air fuel inductive (e.g., power matters alliance (PMA)) or air fuel resonant (e.g., rezence) standard or a scheme defined in the Qi standard.

The wireless power transmission apparatus 101 according to an embodiment may perform communication with the wireless power reception apparatus 195. For example, the wireless power transmission apparatus 101 may perform communication with the wireless power reception apparatus 195 depending on an in-band scheme. The wireless power transmission apparatus 101 may modulate data to be transmitted depending on, for example, a frequency shift keying (FSK) scheme, in a power transmission mode, and the wireless power reception apparatus 195 may perform modulation depending on an amplitude shift keying (ASK) modulation scheme. The wireless power transmission apparatus 101 and/or the wireless power reception apparatus 195 may determine data transmitted from a counterpart device, based on a frequency and/or amplitude of a current, voltage, or power of the coil. The operation of performing the modulation based on the ASK modulation scheme and/or the FSK modulation scheme may be understood as an operation of transmitting data depending on an in-band communication scheme. The operation of performing demodulation based on a frequency and/or amplitude of a current, voltage, or power of the coil and determining data transmitted from the counterpart device may be understood as an operation of receiving data depending on the in-band communication scheme. For example, an electronic device (e.g., wireless power transmission apparatus 101) may perform communication with the wireless power reception apparatus 195 depending on an out-of-band scheme. The wireless power transmission apparatus 101 or the wireless power reception apparatus 195 may transmit and receive data using a communication circuit (e.g., a BLE communication module) provided independently of a coil or a patch antenna.

In the disclosure, that the wireless power transmission apparatus 101 or the wireless power reception apparatus 195 performs a specific operation may mean that various hardware, for example, a control circuit such as a processor (e.g., a transmission ID and/or a micro controlling unit (MCU)) and a coil, which are included in the wireless power transmission apparatus 101 or the wireless power reception apparatus 195, perform the specific operation. Alternatively, that the wireless power transmission apparatus 101 or the wireless power reception apparatus 195 performs a specific operation may mean that the processor controls another hardware to perform the specific operation.

Figure 2:
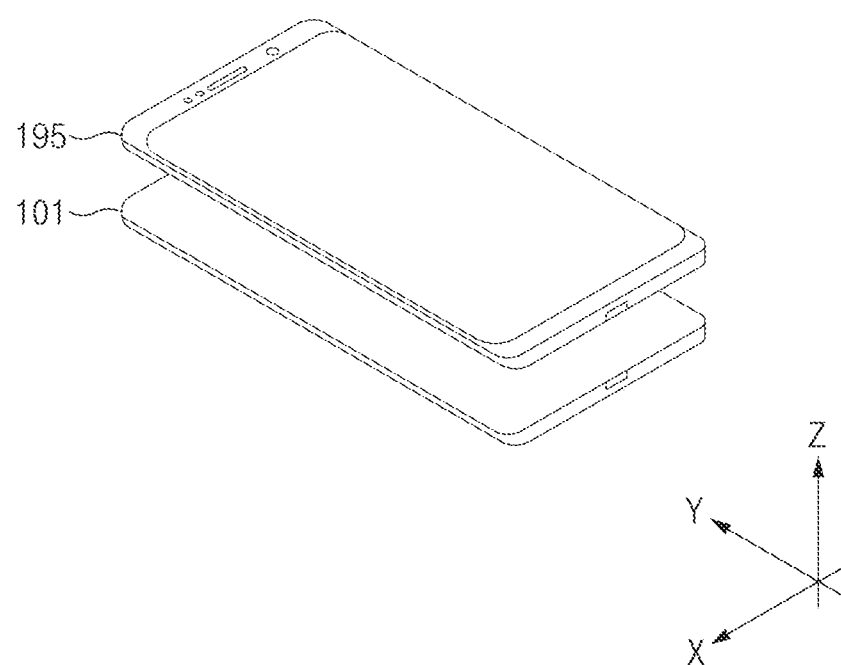
FIG. 2 is a schematic diagram of a wireless charging system according to an embodiment of the disclosure.

FIG. 2 is a schematic diagram of a wireless charging system according to an embodiment of the disclosure.

Referring to FIG. 2, the wireless charging system according to an embodiment may include a wireless power transmission apparatus 101 and a wireless power reception apparatus 195. The wireless power transmission apparatus 101 may be a charging pad which transmits wireless power based on power supplied from a charger (e.g., a travel adapter (TA)). According to another embodiment, the wireless power transmission apparatus 101 may be a device including a wireless power transmission function, which may be implemented as, for example, a smartphone and an implementation form thereof is not limited.

The wireless power reception apparatus 195 may be an electronic device such as a smartphone or a wearable device, and an implementation form thereof is not limited.

Figure 3:
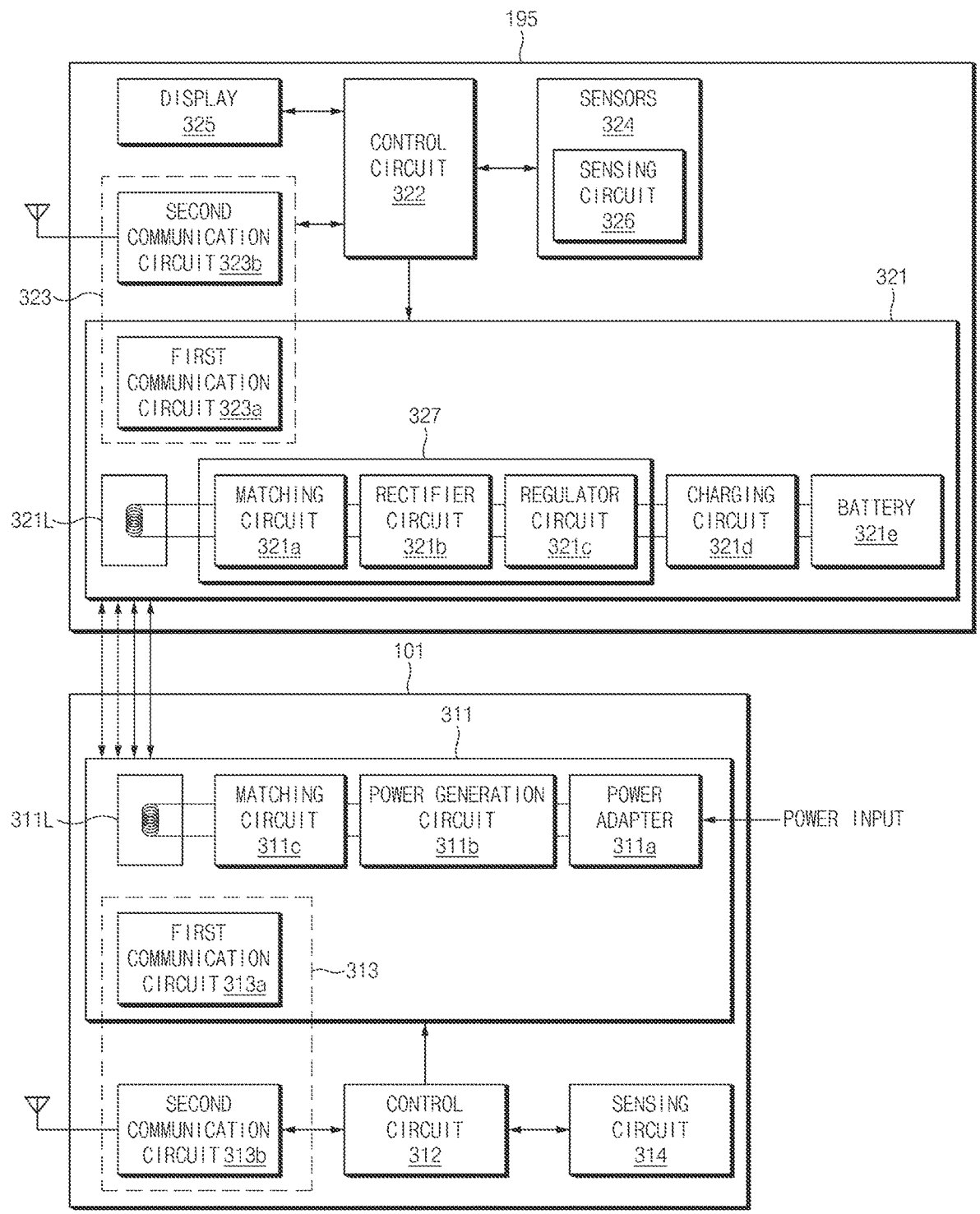
FIG. 3 is a block diagram illustrating a wireless charging system according to an embodiment of the disclosure.

FIG. 3 is a block diagram illustrating a wireless charging system according to an embodiment of the disclosure.

Referring to FIG. 3, a wireless charging system according to an embodiment may include a wireless power transmission apparatus 101 or a wireless power reception apparatus 195. When the wireless power reception apparatus 195 is mounted on the wireless power transmission apparatus 101, the wireless power transmission apparatus 101 may wirelessly supply power to the wireless power reception apparatus 195.

According to an embodiment, the wireless power transmission apparatus 101 may include a power transmission circuit 311, a control circuit 312, a communication circuit 313, or a sensing circuit 314.

According to an embodiment, the power transmission circuit 311 may include at least one of a power adapter 311a, a power generation circuit 311b, a transmit coil 311L, or a matching circuit 311c to facilitate power transmission to at least one electronic device. The power adapter 311a may receive power from the outside and may suitably convert a voltage of the received power. The matching circuit 311c may improve efficiency between the transmit coil 311L and a receive coil 321L.

According to an embodiment, the control circuit 312 may perform the overall control of the wireless power transmission apparatus 101 and may generate and deliver various messages used for wireless power transmission to the communication circuit 313. According to an embodiment, the control circuit 312 may calculate power (or the amount of power) to be transmitted to the wireless power reception apparatus 195 based on information received from the communication circuit 313. According to an embodiment, the control circuit 312 may control the power transmission circuit 311 such that power generated by the transmit coil 311L is transmitted to the wireless power reception apparatus 195.

According to an embodiment, the communication circuit 313 may include at least one of a first communication circuit 313a or a second communication circuit 313b. The first communication circuit 313a may communicate with a first communication circuit 323a of the wireless power reception apparatus 195 based on an in-band (IB) communication scheme using the same or adjacent frequency to a frequency used for power transmission in the transmit coil 311L.

The first communication circuit 313a may communicate with the first communication circuit 323a of the wireless power reception apparatus 195 using the receive coil 311L. Data (or a communication signal) generated by the first communication circuit 313a may be transmitted using the transmit coil 311L. The first communication circuit 313a may deliver data to the wireless power reception apparatus 195 using a frequency shift keying (FSK) modulation scheme. According to an embodiment, the first communication circuit 313a may communicate with the first communication circuit 323a of the wireless power reception apparatus 195 by changing a frequency of the power signal delivered via the transmit coil 311L. Alternatively, the first communication circuit 313a may communicate with the first communication circuit 323a of the wireless power reception apparatus 195 by including data in the power signal generated by the power generation circuit 311b. For example, the first communication circuit 313a may increase or decrease a frequency of the power transmission signal to perform modulation. The wireless power reception apparatus 195 may perform demodulation based on a frequency of the signal measured by the receive coil 321L to identify data from the wireless power transmission apparatus 101.

The second communication circuit 313b may communicate with a second communication circuit 323b of the wireless power reception apparatus 195 based on an out-of-band (OOB) communication scheme using a frequency different from a frequency used for power transmission in the transmit coil 311L. For example, the second communication circuit 313b may obtain information (e.g., a voltage value after the rectifier, rectified voltage value information, information about current flowing in the receive coil 321L or the rectifier circuit 321b, various packets, authentication information, and/or a message) associated with a state of charge from the second communication circuit 323b using any one of various short range communication schemes such as Bluetooth, Bluetooth low energy (BLE), Wi-Fi, or near field communication (NFC).

According to an embodiment, the sensing circuit 314 may include at least one or more sensors and may detect at least one state of the wireless power transmission apparatus 101 using the at least one or more sensors.

According to an embodiment, the sensing circuit 314 may include at least one of a temperature sensor, a motion sensor, a magnetic field sensor (a hall sensor), or a current (or voltage) sensor, may detect a temperature state of the wireless power transmission apparatus 101 using the temperature sensor, may detect a motion state of the wireless power transmission apparatus 101 using the motion sensor, may detect whether it is coupled to the wireless power reception apparatus 195 using the magnetic field sensor, and may detect a state of an output signal of the wireless power transmission apparatus 101, for example, a current level, a voltage level, and/or a power level, using the current (or voltage) sensor.

According to an embodiment, the current (or voltage) sensor may measure a signal from the power transmission circuit 311. The current (or voltage) sensor may measure a signal from at least a portion of the matching circuit 311c or the power generation circuit 311b. The current (or voltage sensor) sensor may include a circuit which measures a signal in a previous stage of the coil 311L.

According to an embodiment, the sensing circuit 314 may be a circuit for foreign substance detection (e.g., foreign object detection (FOD)).

According to an embodiment, the wireless power reception apparatus 195 may include a power reception circuit 321, a control circuit 322, a communication circuit 323, sensors 324, a display 325, or a sensing circuit 326. The sensors 324 may include the sensing circuit 326.

According to an embodiment, the power reception circuit 321 may include a receive coil 321L for wirelessly receiving power from the wireless power transmission apparatus 101, an reception (Rx) integrated circuit (IC) 327, a charging circuit 321d (e.g., a PMIC, a DCDC converter, a switched capacitor, or a voltage divider), or a battery 321e (e.g., a battery 189). In an embodiment, the Rx IC 327 may include a matching circuit 321a connected with the receive coil 321L, a rectifier circuit 321b for rectifying the received AC power to DC, or a regulator circuit (e.g., a low-dropout (LDO) regulator) 321c for regulating a charging voltage.

According to an embodiment, the control circuit 322 may perform the overall control of the wireless power reception apparatus 195 and may generate and deliver various messages used for wireless power reception to the communication circuit 323.

According to an embodiment, the communication circuit 323 may include at least one of a first communication circuit 323a or a second communication circuit 323b. The first communication circuit 323a may communicate with the wireless power transmission apparatus 101 via the receive coil 321L.

The first communication circuit 323a may communicate with the first communication circuit 313a of the wireless power transmission apparatus 101 using the receive coil 321L. Data (or a communication signal) generated by the first communication circuit 323a may be transmitted using the receive coil 321L. The first communication circuit 323a may deliver data to the wireless power transmission apparatus 101 using an amplitude shift keying (ASK) modulation scheme. For example, the first communication circuit 323a may change a load of the wireless power transmission apparatus 101 depending on a modulation scheme. Thus, at least one of a magnitude of voltage, current, or power measured by the transmit coil 311L may be changed. The first communication circuit 313a of the wireless power transmission apparatus 101 may demodulate a change in magnitude to identify data by the wireless power reception apparatus 195. The second communication circuit 323b may communicate with the wireless power transmission apparatus 101 using any one of various short range communication schemes such as Bluetooth, BLE, Wi-Fi, or NFC.

According to an embodiment, the wireless power transmission apparatus 101 and the wireless power reception apparatus 195 may transmit and receive a packet, information, or data using at least one of the first communication circuit 323a or the second communication circuit 323b.

According to an embodiment, the sensors 324 may include at least some of a current/voltage sensor, a temperature sensor, an illumination sensor, or an acceleration sensor. For example, the sensors 324 may be a component which is the same as or independent of a sensor module 1076 which will be described below with reference to FIG. 10.

According to an embodiment, the display 325 may display various display information used for wireless power transmission and reception.

According to an embodiment, the sensing circuit 326 may detect a search signal or received power from the wireless power transmission apparatus 101 to detect the wireless power transmission apparatus 101. The sensing circuit 326 may detect a change in signal of the receive coil 321L or the matching circuit 321a or an input/output terminal of the rectifier circuit 321b by the signal of the receive coil 321L, which is generated by the signal output from the wireless power transmission apparatus 101. According to various embodiments, the sensing circuit 326 may be included in the power reception circuit 321.

In the disclosure, the same configuration as the configuration shown in FIGS. 1, 2, and 3 may refer to the same reference numeral, and a duplicated description of the corresponding configuration will be omitted.

Hereinafter, a description will be given of an arrangement structure of a temperature sensor in the wireless power transmission apparatus according to an embodiment with reference to FIGS. 4A, 4B, and 4C.

Figure 4A:
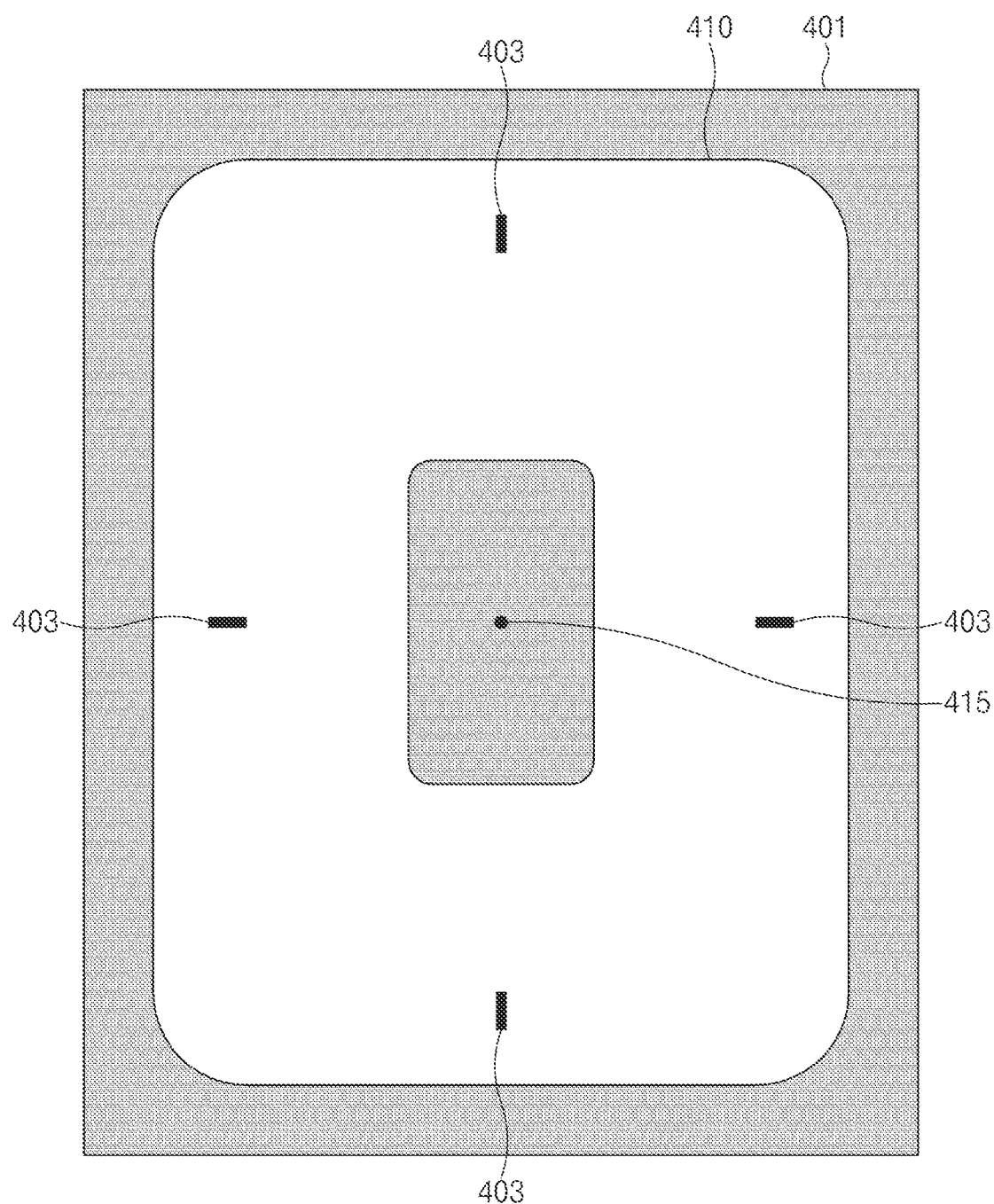
FIG. 4A is a plan view illustrating a state where a substrate, a transmit coil, and a temperature sensor are arranged in a wireless power transmission apparatus according to an embodiment of the disclosure.

FIG. 4A is a plan view illustrating a state where a substrate, a transmit coil, and a temperature sensor are arranged in a wireless power transmission apparatus according to an embodiment of the disclosure.

Figure 4B:
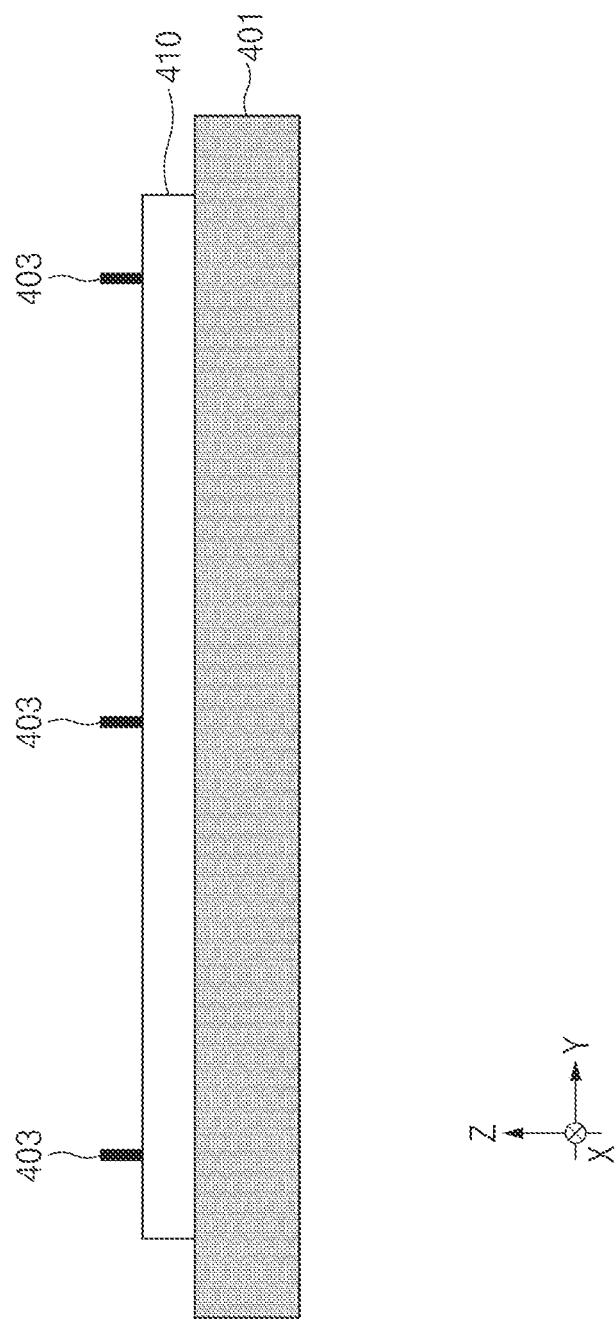
FIG. 4B is a side view illustrating a state where a substrate, a transmit coil, and a temperature sensor are arranged in a wireless power transmission apparatus according to an embodiment of the disclosure.

FIG. 4B is a side view illustrating a state where a substrate, a transmit coil, and a temperature sensor are arranged in a wireless power transmission apparatus according to an embodiment of the disclosure.

Referring to FIGS. 4A and 4B, a wireless power transmission apparatus 101 may include a substrate 401, a transmit coil 410, located on the substrate 401, for transmitting power, and/or at least one temperature sensor 403. The substrate 401 may be mounted on an inner side of an upper housing (e.g., an upper housing 1001 of FIG. 10) and a lower housing (e.g., a lower housing 1003 of FIG. 10).

According to an embodiment, the substrate 401 may mount components of the wireless power transmission apparatus 101, for example, a power transmission circuit (e.g., a power transmission circuit 311 of FIG. 3), a control circuit (e.g., a control circuit 312 of FIG. 3), a communication circuit (e.g., a communication circuit 313 of FIG. 3), and/or a sensing circuit (e.g., a sensing circuit 314 of FIG. 3). The substrate 401 may be implemented using at least one of a printed circuit board (PCB) or a flexible printed circuit board (FPCB). According to an embodiment, the substrate 401 may operate as a ground plate. The substrate 401 may be implemented as various types and structures, and the type and structure of the substrate 401 are not restricted or limited in the disclosure.

According to an embodiment, the transmit coil 410 may be formed by being wound in the form of rotating around a central portion 415 of the coil for wireless charging. According to an embodiment, the transmit coil 410 may be disposed between the upper housing (e.g., the upper housing 1001 of FIG. 10) and the substrate 401. According to an embodiment, when a transmit power from a matching circuit (e.g., a matching circuit 311c of FIG. 3) is supplied, the transmit coil 410 may wirelessly transmit the supplied transmit power. The transmit coil 410 may transmit power in a magnetic induction scheme, a magnetic resonance scheme, or a microwave scheme. The transmit coil 410 may be implemented as a circle with an empty center, an oval, a quadrangle, or a quadrangle with rounded corners. The transmit coil 410 may be implemented as various shapes and structures, and the shape, structure, and number of the transmit coil 410 are not restricted or limited in the disclosure.

The at least one temperature sensor 403 may be mounted at an upper side (e.g., a +Y-axis direction), a lower side (e.g., a –Y-axis direction), a left side (e.g., a +X-axis direction), and/or a right side (e.g., a –X-axis direction) around a central portion 415 of the coil on the transmit coil 410. According to an embodiment, when the at least one temperature sensor 403 is mounted on the transmit coil 410, although metal foreign substances or the like are spaced apart from the central portion of the wireless power transmission apparatus 101, the at least one temperature sensor 403 may effectively sense heat generated the metal foreign substances or the like. According to an embodiment, the at least one temperature sensor 403 may be connected with at least one of components of the wireless power transmission apparatus 101 through a wiring conductor. The at least one temperature sensor 403 may be resistance temperature detectors (RTD), a negative temperature coefficient (NTC) thermistor, a positive temperature coefficient (PTC) thermistor, or a thermocouple. According to an embodiment, the at least one temperature sensor 403 may be implemented to sense heat generated by metal foreign substances present on the wireless power transmission apparatus 101 during wireless charging. According to an embodiment, the at least one temperature sensor 403 may be implemented to provide the control circuit (e.g., the control circuit 312 of FIG. 3) with temperature information sensed to determine whether foreign substances are present. The at least one temperature sensor 403 may include various means capable of detecting a temperature, and the type and number of the at least one temperature sensor 403 are restricted or limited in the disclosure.

Table 1 below is a table in which the temperature of metal foreign substances is measured and written according to a separation distance between a central portion of the metal foreign substances and a central portion of the transmit coil and a time taken to reach the temperature is measured and written, when the magnitude of the transmit power of the wireless power transmission apparatus is 14.3 watt and when the metal foreign substances are located on the wireless power transmission apparatus.

TABLE 1

| Separation distance between wireless power transmission apparatus and wireless power reception apparatus | Separation distance between central portion of metal foreign substances and central portion of transmit coil | Measurement temperature of metal foreign substances | Time taken to reach measured temperature |
|---|---|---|---|
| 0 mm | 0 mm | 104 °C. | 9 minutes 00 seconds |
|  | 10.87 mm | 138.6 °C. | 8 minutes 46 seconds |
|  | 15.87 mm | 133.7 °C. | 10 minutes 52 seconds |
|  | 20.87 mm | 71.4 °C. | 12 minutes 03 seconds |
|  | 25.87 mm | 46.6 °C. | 15 minutes 00 seconds |
|  | 30.87 mm | 33.1 °C. | 16 minutes 55 seconds |
| 2 mm | 0 mm | 91.2 °C. | 9 minutes 40 seconds |
|  | 10.87 mm | 118.8 °C. | 10 minutes 00 seconds |
|  | 15.87 mm | 135 °C. | 9 minutes 10 seconds |
| 5 mm | 0 mm | 93.3 °C. | 15 minutes 00 seconds |
|  | 10.87 mm | 133.9 °C. | 16 minutes 38 seconds |
|  | 15.87 mm | 151.4 °C. | 16 minutes 50 seconds |

According to Table 1 above, while the amount of heat generated by metal foreign substances increases as the separation distance between the central portion of the transmit coil and the central portion of the metal foreign substances are distant from each other, when the separation distance is greater than a certain level, the amount of heat generated by the metal foreign substances may be reduced. In detail, the amount of heat generated by the metal foreign substances is larger than when the separation distance between the central portion of the transmit coil and the central portion of the metal foreign substances is 10.87 mm~20.87 mm than when the metal foreign substances are present on another region. The amount of heat may be maximum, when the separation distance is 15.87 mm.

To reduce the amount of lost power and prevent the electronic device from being damaged, according to Table 1 above, the at least one temperature sensor 403 may be mounted spaced apart from the central portion 415 of the coil to an upper side (e.g., a +Y-axis direction), a lower side (e.g., a −Y-axis direction), a left side (e.g., a +X-axis direction), and/or a right side (e.g., a −X-axis direction) by a specified distance on the transmit coil 410. According to an embodiment, a specified distance may include 5 mm~25 mm. For example, to improve power transmission efficiency, the specified distance may be 10.87 mm~20.87 mm. The at least one temperature sensor 403 may be mounted on various positions on the transmit coil 410, and the position where the at least one temperature sensor 403 is mounted is not restricted or limited in the disclosure.

Figure 4C:
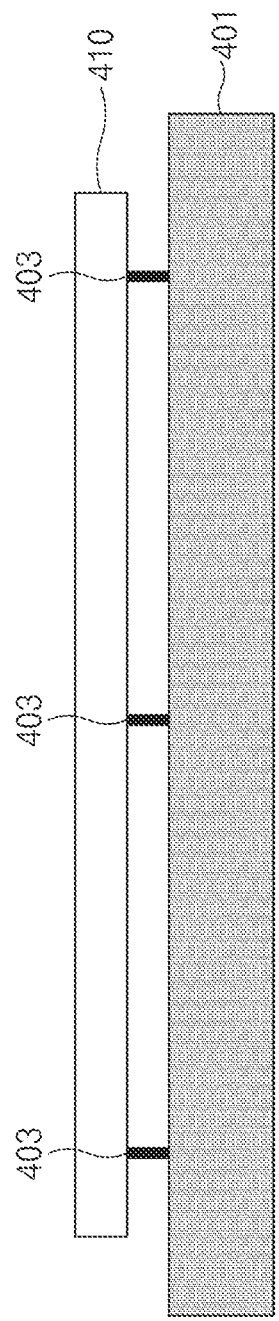
FIG. 4C is a side view illustrating a state where a substrate, a transmit coil, and a temperature sensor are arranged in a wireless power transmission apparatus according to an embodiment of the disclosure.

FIG. 4C is a side view illustrating a state where a substrate, a transmit coil, and a temperature sensor are arranged in a wireless power transmission apparatus according to an embodiment of the disclosure.

Referring to FIG. 4C, at least one temperature sensor 403 may be mounted between a substrate 401 and a transmit coil 410. According to an embodiment, when the at least one temperature sensor 403 is mounted between the substrate 401 and the transmit coil 410, because a distance between the transmit coil 410 and a receive coil (e.g., a receive coil 321L of FIG. 3) of a wireless power reception apparatus (e.g., a wireless power reception apparatus 195 of FIG. 3) is close, power transmission efficiency may be more improved than when the at least one temperature sensor 403 is mounted between an upper housing (e.g., an upper housing 1001 of FIG. 10) and the transmit coil 410.

The at least one temperature sensor 403 may be mounted at an upper side (e.g., a +Y-axis direction), a lower side (e.g., a −Y-axis direction), a left side (e.g., a +X-axis direction), and/or a right side (e.g., a −X-axis direction) around a central portion 415 of the coil between the substrate 401 and the transmit coil 410. According to an embodiment, when the at least one temperature sensor 403 is mounted between the substrate 401 and the transmit coil 410, although metal foreign substances are spaced apart from the central portion of the wireless power transmission apparatus 101, the at least one temperature sensor 403 may effectively sense heat generated by the metal foreign substances or the like. To reduce the amount of lost power and prevent the electronic device from being damaged, the at least one temperature sensor 403 may be mounted spaced apart from the central portion 415 of the coil to an upper side (e.g., a +Y-axis direction), a lower side (e.g., a −Y-axis direction), a left side (e.g., a +X-axis direction), and/or a right side (e.g., a −X-axis direction) by a specified distance between the substrate 401 and the transmit coil 410. According to an embodiment, a specified distance may be 5 mm~25 mm. For example, to improve power transmission efficiency, the specified distance may be 10.87 mm~20.87 mm. The at least one temperature sensor 403 may be mounted on various positions between the substrate 401 and the transmit coil 410, and the position where the at least one temperature sensor 403 is mounted is not restricted or limited in the disclosure.

In the disclosure, the same configuration as the configuration shown in FIGS. 4A, 4B, and 4C may refer to the same reference numeral, and a duplicated description of the corresponding configuration will be omitted.

Hereinafter, a description will be given of an arrangement structure of a temperature sensor having a pattern resistor in the wireless power transmission apparatus according to an embodiment with reference to FIGS. 5A, 5B, and 5C.

Figure 5A:
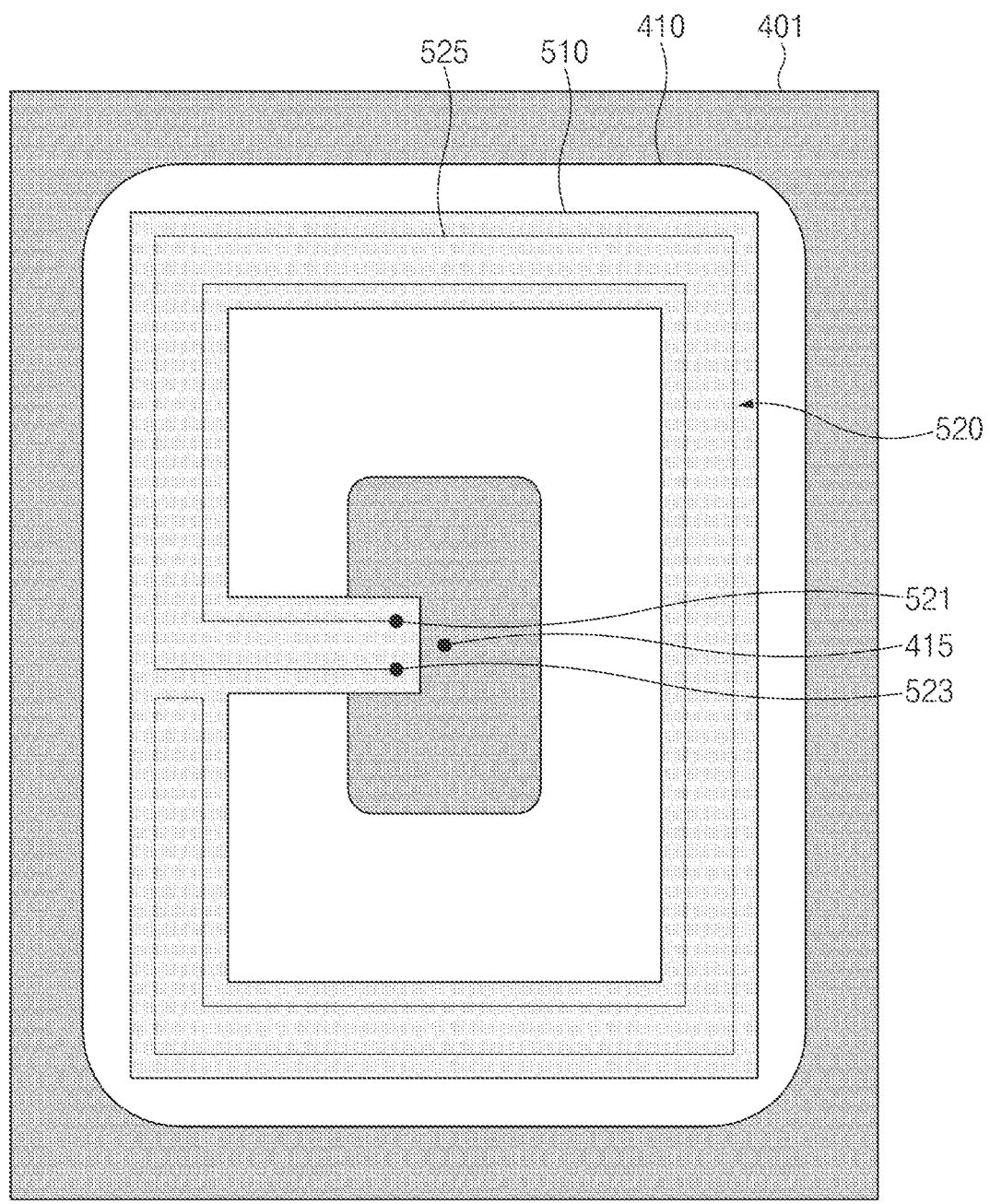
FIG. 5A is a plan view illustrating a state where a substrate, a transmit coil, an FPCB, and a temperature sensor are arranged in a wireless power transmission apparatus according to an embodiment of the disclosure.

FIG. 5A is a plan view illustrating a state where a substrate, a transmit coil, an FPCB, and a temperature sensor are arranged in a wireless power transmission apparatus according to an embodiment of the disclosure.

Figure 5B:
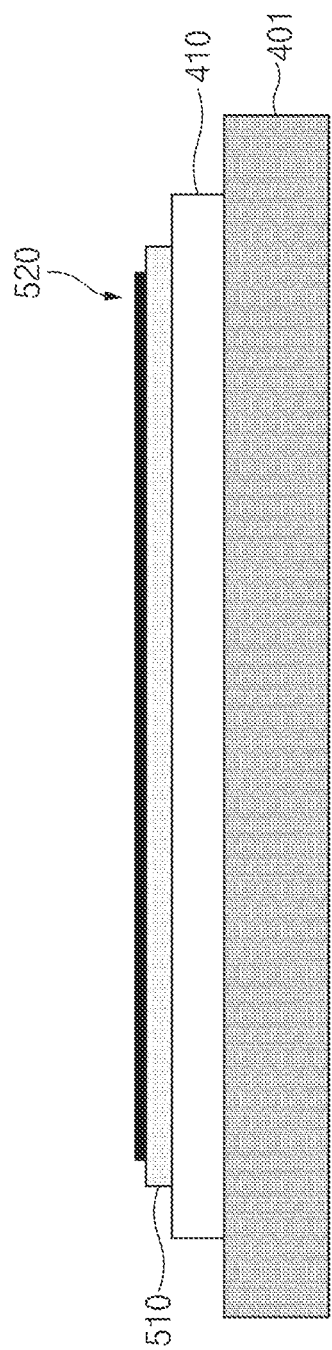
FIG. 5B is a side view illustrating a state where a substrate, a transmit coil, an FPCB, and a temperature sensor are arranged in a wireless power transmission apparatus according to an embodiment of the disclosure.

FIG. 5B is a side view illustrating a state where a substrate, a transmit coil, an FPCB, and a temperature sensor are arranged in a wireless power transmission apparatus according to an embodiment of the disclosure.

Referring to FIGS. 5A and 5B, a transmit coil 410, an FPCB 510, a temperature sensor 520 may be mounted in order in the direction of a +Z-axis on a substrate 401 in a wireless power transmission apparatus 101.

According to an embodiment, the temperature sensor 520 may include a pattern resistor 525, the resistance numerical value of which varies with a temperature to sense the temperature. The material of the pattern resistor 525 may be at least one of platinum, nickel, or copper. The temperature sensor 520 may be implemented as various types, and the type and number of the temperature sensor 520 are not restricted or limited in the disclosure.

According to an embodiment, the pattern resistor 525 may be mounted on the FPCB 510. The pattern resistor 525 may be mounted at an upper side (e.g., a +Y-axis direction), a lower side (e.g., a −Y-axis direction), a left side (e.g., a +X-axis direction), and/or a right side (e.g., a −X-axis direction) around a central portion 415 of the coil on the FPCB 510. In this case, although metal foreign substances or the like are spaced apart from the central portion of the wireless power transmission apparatus 101, the pattern resistor 525 may effectively detect heat generated by the metal foreign substances or the like. To reduce the amount of lost power and prevent the electronic device from being damaged, the pattern resistor 525 may be mounted spaced apart from a central portion 415 of the coil to an upper side (e.g., a +Y-axis direction), a lower side (e.g., a −Y-axis direction), a left side (e.g., a +X-axis direction), and/or a right side (e.g., a −X-axis direction) by a specified distance on the FPCB 510. According to an embodiment, the specified distance may be 5 mm~25 mm. For example, to improve power transmission efficiency, the specified distance may be 10.87 mm~20.87 mm. The pattern resistor 525 may be mounted on various positions on the FPCB 510, and the position where the pattern resistor 525 is mounted is not restricted or limited in the disclosure.

The pattern resistor 525 may include a first end 521 and a second end 523 at its both ends. As an example, the first end 521 may be a point where current flows in, and the second end 523 may be a point where current flows out. As another example, the first end 521 may be a point where current flows out, and the second end 523 may be a point where current flows in.

According to an embodiment, the pattern resistor 525 may be formed in a pattern of being wound in a first direction from any first point (not shown) on the FPCB 510 to any second point (not shown) different from the any first point (not shown) on the FPCB 510 around the central portion 415 of the coil and being rewound in a second direction opposite to the first direction. According to an embodiment, the pattern resistor 525 may be formed in a pattern of winding one turn in the first direction around the central portion 415 of the coil from any first point (not shown) on the FPCB 510 and rewinding one turn in the second direction opposite to the first direction. For example, the first direction may be a clockwise direction, and the second direction may be a counterclockwise direction. For another example, the first direction may be a counterclockwise direction, and the second direction may be a clockwise direction. As the pattern resistor 525 is influenced by a magnetic field generated by the transmit coil 410, current may be generated in the pattern resistor 525 and heat by an internal resistance value of the pattern resistor 525 may be generated by the generated current. At this time, the pattern resistor 525 may reduce an influence by a magnetic field generated by the transmit coil 410 using a magnetic field offset effect between patterns of being wound around the central portion 415 of the coil and being rewound in a direction opposite to the wound direction.

According to an embodiment, the FPCB 510 may be implemented as a structure where the pattern resistor 525 may be mounted on the FPCB 510. According to an embodiment, a surface where the FPCB 510 and the transmit coil 410 are in contact with each other and a surface where the pattern resistor 525 is mounted may be formed to have a minimum size (e.g., area) where the pattern resistor 525 may be mounted. The FPCB 510 may be implemented as various types and structures, and the type and structure of the FPCB 510 are not restricted or limited in the disclosure.

In the disclosure, the same configuration as the configuration shown in FIGS. 5A and 5B may refer to the same reference numeral, and a duplicated description of the corresponding configuration will be omitted.

Figure 5C:
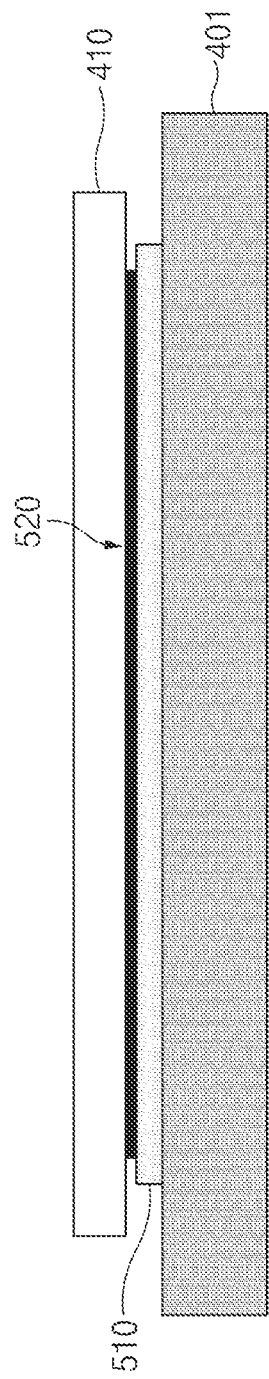
FIG. 5C is a side view illustrating a state where a substrate, a transmit coil, an FPCB, and a temperature sensor are arranged in a wireless power transmission apparatus according to an embodiment of the disclosure.

FIG. 5C is a side view illustrating a state where a substrate, a transmit coil, an FPCB, and a temperature sensor are arranged in a wireless power transmission apparatus according to an embodiment of the disclosure.

Referring to FIG. 5C, an FPCB 510, a temperature sensor 520, a transmit coil 410 may be mounted in order in the direction of a +Z-axis on a substrate 401 in a wireless power transmission apparatus 101.

According to an embodiment, when the FPCB 510 and the pattern resistor 525 are mounted between the substrate 401 and the transmit coil 410, because a distance between the transmit coil 410 and a receive coil (e.g., a receive coil 321L of FIG. 3) of a wireless power reception apparatus (e.g., a wireless power reception apparatus 195 of FIG. 3) is close, power transmission efficiency may be more improved than when the FPCB 510 and the pattern resistor 525 are mounted between an upper housing (e.g., an upper housing 1001 of FIG. 10) and the transmit coil 410.

According to an embodiment, the pattern resistor 525 may be mounted on the FPCB 510. For example, the pattern resistor 525 may be mounted at an upper side (e.g., a +Y-axis direction), a lower side (e.g., a −Y-axis direction), a left side (e.g., a +X-axis direction), and/or a right side (e.g., a −X-axis direction) around a central portion 415 of the coil on the FPCB 510. In this case, although metal foreign substances or the like are spaced apart from the central portion of the wireless power transmission apparatus 101, the pattern resistor 525 may effectively detect heat generated by the metal foreign substances or the like. To reduce the amount of lost power and prevent the electronic device from being damaged, the pattern resistor 525 may be mounted spaced apart from the central portion 415 of the coil to an upper side (e.g., a +Y-axis direction), a lower side (e.g., a −Y-axis direction), a left side (e.g., a +X-axis direction), and/or a right side (e.g., a −X-axis direction) by a specified distance on the FPCB 510. According to an embodiment, the specified distance may be 5 mm~25 mm. For example, to improve power transmission efficiency, the specified distance may be 10.87 mm~20.87 mm. The pattern resistor 525 may be mounted on various positions on the FPCB 510, and the position where the pattern resistor 525 is mounted is not restricted or limited in the disclosure.

According to an embodiment, the pattern resistor 525 may be formed in a pattern of being wound in a first direction from any first point (not shown) on the FPCB 510 to any second point (not shown) different from the any first point (not shown) on the FPCB 510 around the central portion 415 of the coil and being rewound in a second direction opposite to the first direction. According to an embodiment, the pattern resistor 525 may be formed in a pattern of winding one turn in the first direction around the central portion 415 of the coil from any first point (not shown) on the FPCB 510 and rewinding one turn in the second direction opposite to the first direction. For example, the first direction may be a clockwise direction, and the second direction may be a counterclockwise direction. For another example, the first direction may be a counterclockwise direction, and the second direction may be a clockwise direction. The pattern resistor 525 may reduce an influence by a magnetic field generated by the transmit coil 410 using a magnetic field offset effect between patterns of being wound around the central portion 415 of the coil and being rewound in a direction opposite to the wound direction.

According to various embodiments, the FPCB 510 may be implemented as a structure where the pattern resistor 525 may be mounted on the FPCB 510. According to an embodiment, a surface where the FPCB 510 and the substrate 401 are in contact with each other and a surface where the pattern resistor 525 is mounted may be formed to have a minimum size (e.g., area) where the pattern resistor 525 may be mounted. The FPCB 510 may be implemented as various types and structures, and the type and structure of the FPCB 510 are not restricted or limited in the disclosure.

Hereinafter, a description will be given of an arrangement structure of a temperature sensor and a wiring conductor in the wireless power transmission apparatus according to an embodiment with reference to FIGS. 6A, 6B, and 6C.

Figure 6A:
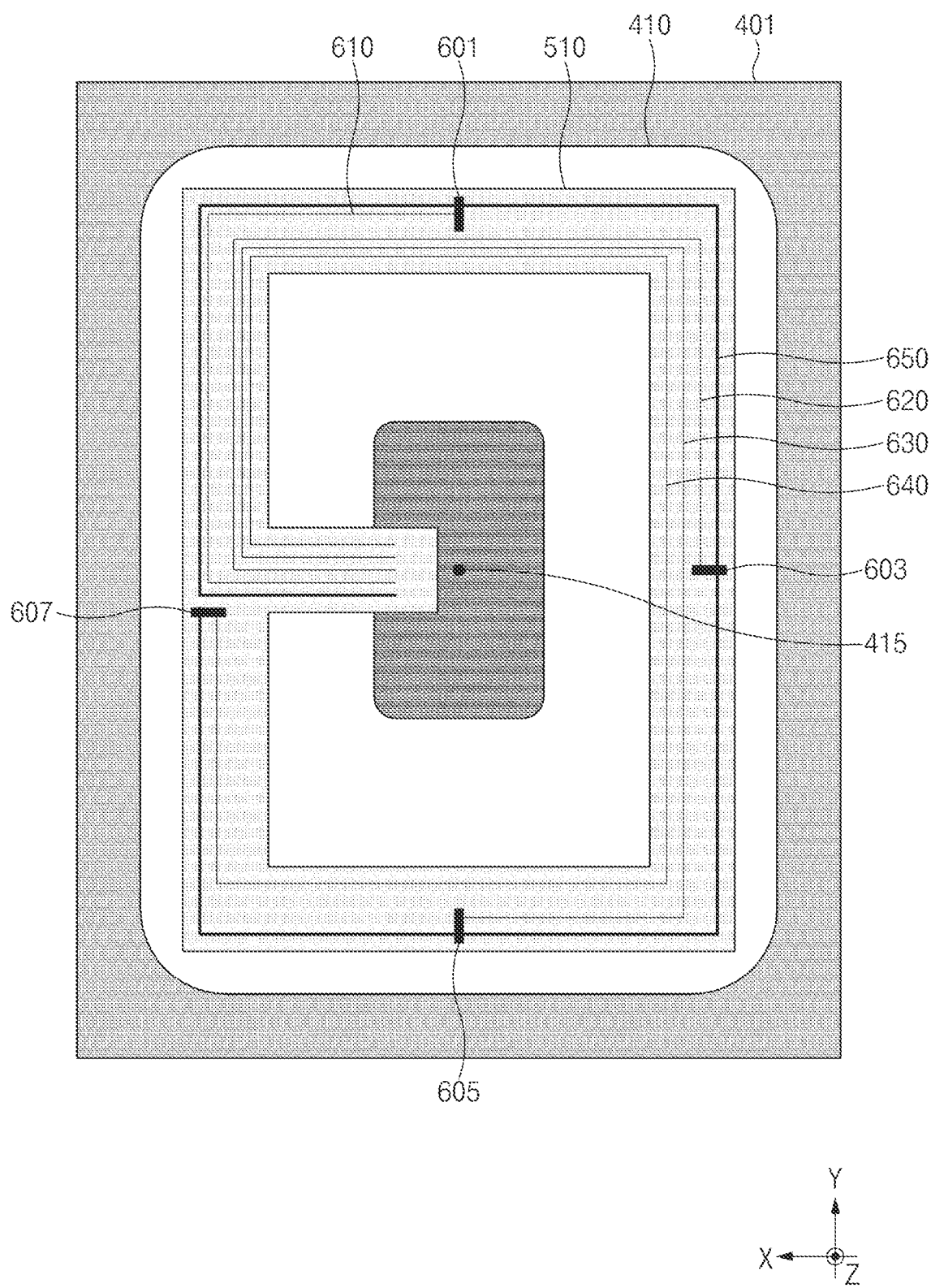
FIG. 6A is a plan view illustrating a state where a substrate, a transmit coil, an FPCB, and a temperature sensor are arranged in a wireless power transmission apparatus according to an embodiment of the disclosure.

FIG. 6A is a plan view illustrating a state where a substrate, a transmit coil, an FPCB, and a temperature sensor are arranged in a wireless power transmission apparatus according to an embodiment of the disclosure.

Figure 6B:
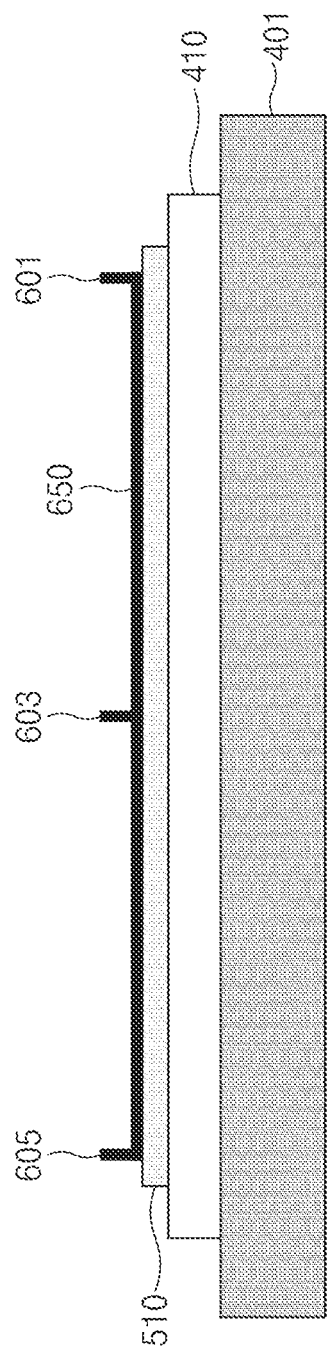
FIG. 6B is a side view illustrating a state where a substrate, a transmit coil, an FPCB, and a temperature sensor are arranged in a wireless power transmission apparatus according to an embodiment of the disclosure.

FIG. 6B is a side view illustrating a state where a substrate, a transmit coil, an FPCB, and a temperature sensor are arranged in a wireless power transmission apparatus according to an embodiment of the disclosure.

Referring to FIGS. 6A and 6B, a transmit coil 410 and an FPCB 510 may be mounted in order in the direction of a +Z-axis on a substrate 401 in a wireless power transmission apparatus 101. A first temperature sensor 601, a second temperature sensor 603, a third temperature sensor 605, a fourth temperature sensor 607, a first wiring conductor 610, a second wiring conductor 620, a third wiring conductor 630, a fourth wiring conductor 640, and/or ground wiring 650 may be mounted between an upper housing (e.g., an upper housing 1001 of FIG. 10) and the FPCB 510.

According to an embodiment, the first to fourth temperature sensors 601, 603, 605, and 607 may be mounted on the FPCB 510. For example, the first temperature sensor 601 may be mounted at an upper side (e.g., a +Y-axis direction), the second temperature sensor 603 may be mounted at a right side (e.g., a −X-axis direction), the third temperature sensor 605 may be mounted at a lower side (e.g., a −Y-axis direction), and the fourth temperature sensor 607 may be mounted at a left side (e.g., a +X-axis direction), around a central portion 415 of the coil on the FPCB 510. In this case, although metal foreign substances are spaced apart from the central portion of the wireless power transmission apparatus 101, heat generated by the metal foreign substances may be effectively detected.

For the first to fourth temperature sensors 601, 603, 605, and 607 to reduce the amount of lost power and prevent the electronic device from being damaged, the first temperature sensor 601 may be mounted spaced apart from the central portion 415 of the coil to an upper side (e.g., a +Y-axis direction) on the FPCB 510 by a specified distance, the third temperature sensor 605 may be mounted spaced apart from the central portion 415 of the coil to a lower side (e.g., a −Y-axis direction) by the specified distance, the fourth temperature sensor 607 may be mounted spaced apart from the central portion 415 of the coil to a left side (e.g., a +X-axis direction) by the specified distance, and the second temperature sensor 603 may be mounted spaced apart from the central portion 415 of the coil to a right side (e.g., a −X-axis direction) by the specified distance. According to an embodiment, the specified distance may be 5 mm~25 mm. For example, to improve power transmission efficiency, the specified distance may be 10.87 mm~20.87 mm. The first to fourth temperature sensors 601, 603, 605, and 607 may be mounted at various positions on the FPCB 510, and the positions where the first to fourth temperature sensors 601, 603, 605, and 607 are mounted are not restricted or limited in the disclosure.

The first to fourth temperature sensors 601, 603, 605, and 607 may be at least one of an NTC thermistor, a PTC thermistor, or a thermocouple. The first to fourth temperature sensors 601, 603, 605, and 607 may be mounted as various types, and the types and number of the first to fourth temperature sensors 601, 603, 605, and 607 are not restricted or limited in the disclosure.

According to an embodiment, first to fourth wiring conductors 610, 620, 630, and 640 respectively connecting the first to fourth temperature sensors 601, 603, 605, and 607 may be mounted on the FPCB 510. According to an embodiment, each of the first to fourth wiring conductors 610, 620, 630, and 640 may be wound in a first direction from one end to a point where each of the first to fourth temperature sensors 601, 603, 605, and 607 is located around the central portion 415 of the coil on the FPCB 510, and the other end of each of the first to fourth wiring conductors 610, 620, 630, and 640 may be connected to each of the first to fourth temperature sensors 601, 603, 605, and 607. For example, the first direction may be a clockwise direction or a counterclockwise direction. The first to fourth wiring conductors 610, 620, 630, and 640 may respectively deliver a signal (e.g., a voltage (or current) signal), delivered from components (e.g., a control circuit 312 or a sensing circuit 314 of FIG. 3), to the first to fourth temperature sensors 601, 603, 605, and 607. Furthermore, the first to fourth wiring conductors 610, 620, 630, and 640 may deliver temperature information generated by sensing a temperature at each of the first to fourth temperature sensors 601, 603, 605, and 607 to components in the wireless power transmission apparatus 101.

According to an embodiment, the ground wiring 650 may be wound in a second direction opposite to the first direction around the central portion 415 of the coil from any point on the FPCB 510 and may connect each of the first to fourth temperature sensors 601, 603, 605, and 607. For example, the first direction may be a clockwise direction, and the second direction may be a counterclockwise direction. For another example, the first direction may be a counterclockwise direction, and the second direction may be a clockwise direction. According to an embodiment, the ground wiring 650 may play a role in connecting the ground with the first to fourth temperature sensors 601, 603, 605, and 607.

As the first to fourth wiring conductors 610, 620, 630, and 640 and the ground wiring 650 are influenced by a magnetic field generated by the transmit coil 410, current may be generated in the first to fourth wiring conductors 610, 620, 630, and 640 and the ground wiring 650, and heat by an internal resistance value of wiring may be generated by the generated current. At this time, an influence by a magnetic field generated by the transmit coil 410 may be reduced using a magnetic field offset effect between a pattern of being wound in a first direction from any point on the FPCB 510 of the first to fourth wiring conductors 610, 620, 630, and 640 to a point where the first to fourth temperature sensors 601, 603, 605, and 607 are located around the central portion 415 of the coil and being connected with the first to fourth temperature sensors 601, 603, 605, and 607 and a pattern of being rewound in a second direction opposite to the first direction where the first to fourth wiring conductors 610, 620, 630, and 640 are wound around the central portion 415 of the coil from a point where the ground wiring 650 is connected with the first to fourth temperature sensors 601, 603, 605, and 607.

According to an embodiment, the FPCB 510 may be implemented as a structure where the first to fourth temperature sensors 601, 603, 605, and 607, the first to fourth wiring conductors 610, 620, 630, and 640, and the ground wiring 650 may be mounted on the FPCB 510. According to an embodiment, a surface where the FPCB 510 and the transmit coil are in contact with each other and a surface where the first to fourth temperature sensors 601, 603, 605, and 607, the first to fourth wiring conductors 610, 620, 630, and 640, and the ground wiring 650 are mounted may be formed to have a minimum size (e.g., area) where the first to fourth temperature sensors 601, 603, 605, and 607, the first to fourth wiring conductors 610, 620, 630, and 640, and the ground wiring 650 may be mounted. The FPCB 510 may be implemented as various types and structures, and the type and structure of the FPCB 510 are not restricted or limited in the disclosure.

In the disclosure, the same configuration as the configuration shown in FIGS. 6A and 6B may refer to the same reference numeral, and a duplicated description of the corresponding configuration will be omitted.

Figure 6C:
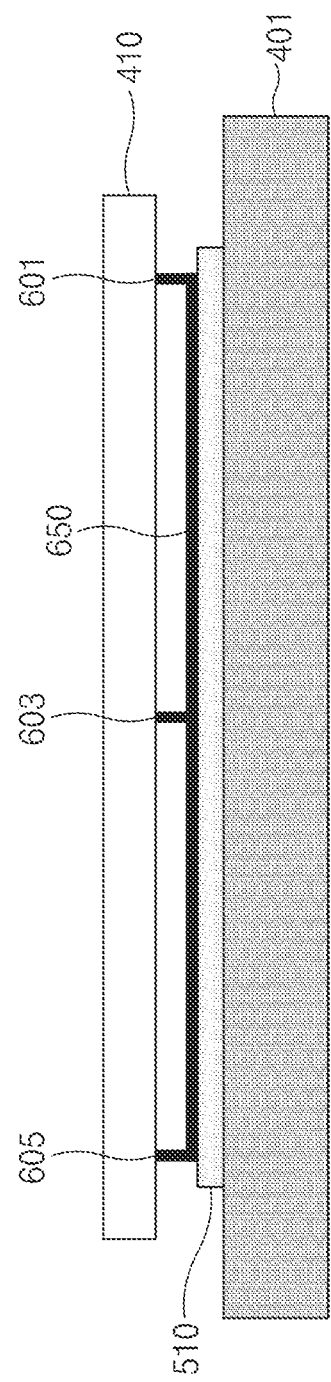
FIG. 6C is a side view illustrating a state where a substrate, a transmit coil, an FPCB, and a temperature sensor are arranged in a wireless power transmission apparatus according to an embodiment of the disclosure.

FIG. 6C is a side view illustrating a state where a substrate, a transmit coil, an FPCB, and a temperature sensor are arranged in a wireless power transmission apparatus according to an embodiment of the disclosure.

Referring to FIG. 6C, an FPCB 510 and a transmit coil 410 may be mounted in order in the direction of a +Z-axis on a substrate 401 in a wireless power transmission apparatus 101. A first temperature sensor 601, a second temperature sensor 603, a third temperature sensor 605, a fourth temperature sensor 607, a first wiring conductor 610, a second wiring conductor 620, a third wiring conductor 630, a fourth wiring conductor 640, and/or ground wiring 650 may be mounted between the FPCB 510 and the transmit coil 410.

According to an embodiment, when the FPCB 510 and the first to fourth temperature sensors 601, 603, 605, and 607 are mounted between the substrate 401 and the transmit coil 410, because a distance between the transmit coil 410 and a receive coil (e.g., a receive coil 321L of FIG. 3) of a wireless power reception apparatus (e.g., a wireless power reception apparatus 195 of FIG. 3) is close, power transmission efficiency may be more improved than when the FPCB 510 and the first to fourth temperature sensors 601, 603, 605, and 607 are mounted between an upper housing (e.g., an upper housing 1001 of FIG. 10) and the transmit coil 410.

According to an embodiment, the first to fourth temperature sensors 601, 603, 605, and 607 may be mounted on the FPCB 510. For example, the first temperature sensor 601 may be mounted at an upper side (e.g., a +Y-axis direction), the second temperature sensor 603 may be mounted at a right side (e.g., a −X-axis direction), the third temperature sensor 605 may be mounted at a lower side (e.g., a −Y-axis direction), and the fourth temperature sensor 607 may be mounted at a left side (e.g., a +X-axis direction), around a central portion 415 of the coil on the FPCB 510. In this case, although metal foreign substances are spaced apart from the central portion of the wireless power transmission apparatus 101, heat generated by the metal foreign substances may be effectively detected.

For the first to fourth temperature sensors 601, 603, 605, and 607 to reduce the amount of lost power and prevent the electronic device from being damaged, the first temperature sensor 601 may be mounted spaced apart from the central portion 415 of the coil to an upper side (e.g., a +Y-axis direction) on the FPCB 510 by a specified distance, the third temperature sensor 605 may be mounted spaced apart from the central portion 415 of the coil to a lower side (e.g., a −Y-axis direction) by the specified distance, the fourth temperature sensor 607 may be mounted spaced apart from the central portion 415 of the coil to a left side (e.g., a +X-axis direction) by the specified distance, and the second temperature sensor 603 may be mounted spaced apart from the central portion 415 of the coil to a right side (e.g., a −X-axis direction) by the specified distance. According to an embodiment, the specified distance may be 5 mm~25 mm. For example, to improve power transmission efficiency, the specified distance may be 10.87 mm~20.87 mm. The first to fourth temperature sensors 601, 603, 605, and 607 may be mounted at various positions on the FPCB 510, and the positions where the first to fourth temperature sensors 601, 603, 605, and 607 are mounted are not restricted or limited in the disclosure.

Hereinafter, a description will be given of an arrangement structure of a wire type temperature sensor in the wireless power transmission apparatus according to an embodiment with reference to FIGS. 7A, 7B, and 7C.

Figure 7A:
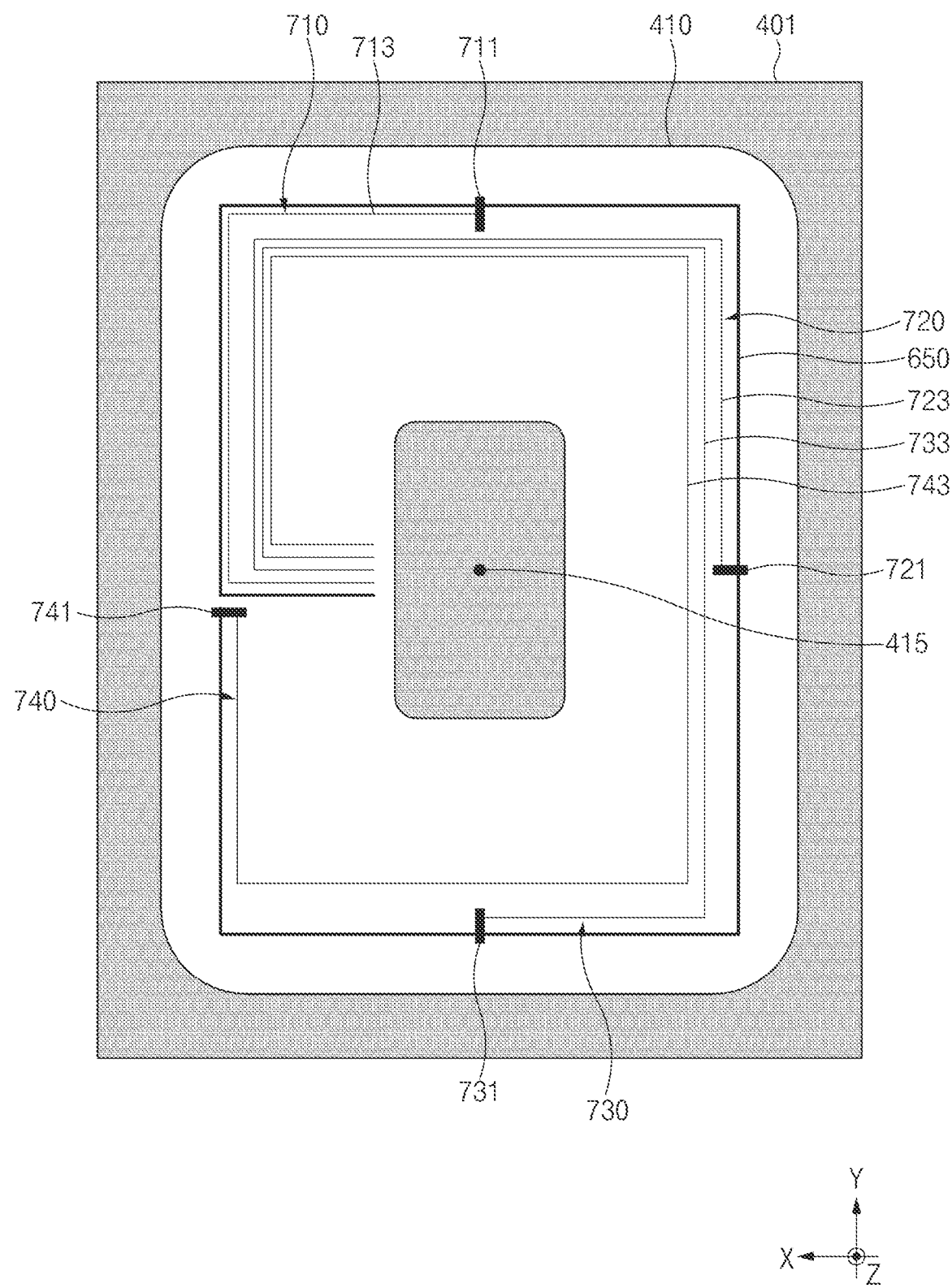
FIG. 7A is a plan view illustrating a state where a substrate, a transmit coil, and a wire type temperature sensor are arranged in a wireless power transmission apparatus according to an embodiment of the disclosure.

FIG. 7A is a plan view illustrating a state where a substrate, a transmit coil, and a wire type temperature sensor are arranged in a wireless power transmission apparatus according to an embodiment of the disclosure.

Figure 7B:
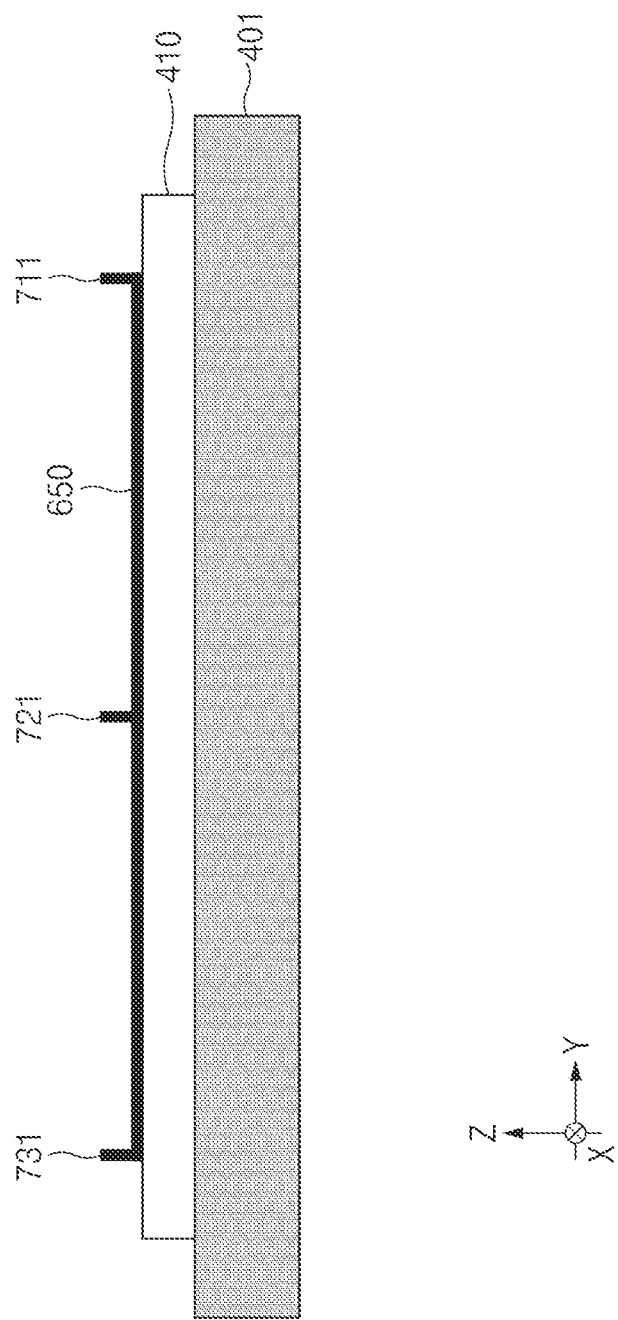
FIG. 7B is a side view illustrating a state where a substrate, a transmit coil, and a wire type temperature sensor are arranged in a wireless power transmission apparatus according to an embodiment of the disclosure.

FIG. 7B is a side view illustrating a state where a substrate, a transmit coil, and a wire type temperature sensor are arranged in a wireless power transmission apparatus according to an embodiment of the disclosure.

Referring to FIGS. 7A and 7B, a transmit coil 410 may be mounted between an upper housing (e.g., an upper housing 1001 of FIG. 10) and a substrate 401, and a first wire type temperature sensor 710, a second wire type temperature sensor 720, a third wire type temperature sensor 730, a fourth wire type temperature sensor 740, and/or ground wiring 650 may be mounted between the upper housing (e.g., the upper housing 1001 of FIG. 10) and the transmit coil 410.

According to an embodiment, the first to fourth wire type temperature sensors 710, 720, 730, and 740 may include first to fourth temperature sensing units 711, 721, 731, and 741 and first to fourth wires 713, 723, 733, and 743, respectively.

According to an embodiment, the first to fourth temperature sensing units 711, 721, 731, and 741 may be mounted on the transmit coil 410. For example, the first temperature sensing unit 711 may be mounted at an upper side (e.g., a +Y-axis direction), the second temperature sensing unit 721 may be mounted at a right side (e.g., a −X-axis direction), the third temperature sensing unit 731 may be mounted at a lower side (e.g., a −Y-axis direction), and the fourth temperature sensing unit 741 may be mounted at a left side (e.g., a +X-axis direction), around a central portion 415 of the coil on the transmit coil 410. In this case, although metal foreign substances are spaced apart from the central portion of the wireless power transmission apparatus 101, heat generated by the metal foreign substances may be effectively detected.

For the first to fourth temperature sensing units 711, 721, 731, and 741 to reduce the amount of lost power and prevent the electronic device from being damaged, the first temperature sensing unit 711 may be mounted spaced apart from the central portion 415 of the coil to an upper side (e.g., the +Y-axis direction) on the transmit coil 410 by a specified distance, the third temperature sensing unit 731 may be mounted spaced apart from the central portion 415 of the coil to a lower side (e.g., the −Y-axis direction) by the specified distance, the fourth temperature sensing unit 741 may be mounted spaced apart from the central portion 415 of the coil to a left side (e.g., a +X-axis direction) by the specified distance, and the second temperature sensing unit 721 may be mounted spaced apart from the central portion 415 of the coil to a right side (e.g., a −X-axis direction) by the specified distance. According to an embodiment, the specified distance may be 5 mm~25 mm. For example, to improve power transmission efficiency, the specified distance may be 10.87 mm~20.87 mm. The first to fourth temperature sensing units 711, 721, 731, and 741 may be mounted at various positions on the transmit coil 410, and the positions where the first to fourth temperature sensing units 711, 721, 731, and 741 are mounted are not restricted or limited in the disclosure.

The first to fourth wire type temperature sensors 710, 720, 730, and 740 may be at least one of a wire type NTC thermistor, a wire type PTC thermistor, or a wire type thermocouple. The first to fourth wire type temperature sensors 710, 720, 730, and 740 may be mounted as various types, and the types and number of the first to fourth wire type temperature sensors 710, 720, 730, 740 are not restricted or limited in the disclosure.

According to an embodiment, each of the first to fourth wires 713, 723, 733, and 743 may be wound from one end to a point where each of the first to fourth temperature sensing units 711, 721, 731, and 741 is located around the central portion 415 of the coil, and the other end of each of the first to fourth wires 713, 723, 733, 743 may be connected to each of the first to fourth temperature sensing units 711, 721, 731, and 741.

According to an embodiment, the ground wiring 650 may be wound around the central portion 415 of the coil from any point on the transmit coil 410 and may connect each of the first to fourth temperature sensing units 711, 721, 731, and 741. According to an embodiment, the ground wiring 650 may play a role in connecting the ground with the first to fourth temperature sensing units 711, 721, 731, and 741.

As the first to fourth wires 713, 723, 733, and 743 and the ground wiring 650 are influenced by a magnetic field generated by the transmit coil 410, current may be generated in the first to fourth wires 713, 723, 733, and 743 and the ground wiring 650, and heat by an internal resistance value of the wire and the wiring may be generated by the generated current. At this time, an influence by a magnetic field generated by the transmit coil 410 may be reduced using a magnetic field offset effect between a pattern of being wound from any point on the transmit coil 410 of the first to fourth wires 713, 723, 733, and 743 to a point where the first to fourth temperature sensing units 711, 721, 731, and 741 are located around the central portion 415 of the coil and being connected with the first to fourth temperature sensing units 711, 721, 731, and 741 and a pattern of being rewound in a direction opposite to the direction where the first to fourth wires 713, 723, 733, and 743 are wound around the central portion 415 of the coil from a point where the ground wiring 650 is connected with the first to fourth temperature sensing units 711, 721, 731, and 741.

In the disclosure, the same configuration as the configuration shown in FIGS. 7A and 7B may refer to the same reference numeral, and a duplicated description of the corresponding configuration will be omitted.

Figure 7C:
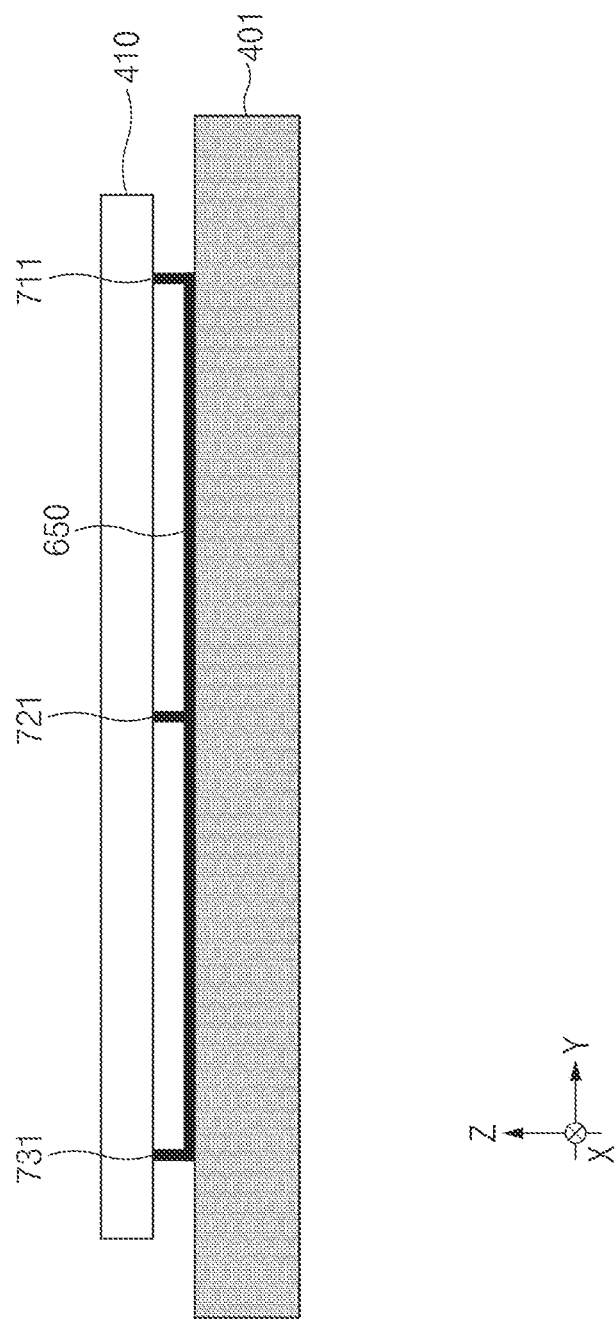
FIG. 7C is a side view illustrating a state where a substrate, a transmit coil, and a wire type temperature sensor are arranged in a wireless power transmission apparatus according to an embodiment of the disclosure.

FIG. 7C is a side view illustrating a state where a substrate, a transmit coil, and a wire type temperature sensor are arranged in a wireless power transmission apparatus according to an embodiment of the disclosure.

Referring to FIG. 7C, a transmit coil 410 may be mounted between an upper housing (e.g., an upper housing 1001 of FIG. 10) and a substrate 401, and a first wire type temperature sensor 710, a second wire type temperature sensor 720, a third wire type temperature sensor 730, a fourth wire type temperature sensor 740, and/or ground wiring 650 may be mounted between the substrate 401 and the transmit coil 410.

According to an embodiment, when the first to fourth wire type temperature sensors 710, 720, 730, and 740 are mounted between the substrate 401 and the transmit coil 410, because a distance between the transmit coil 410 and a receive coil (e.g., a receive coil 321L of FIG. 3) of a wireless power reception apparatus (e.g., a wireless power reception apparatus 195 of FIG. 3) is close, power transmission efficiency may be more improved than when the first to fourth wire type temperature sensors 710, 720, 730, and 740 are mounted between the upper housing (e.g., the upper housing 1001 of FIG. 10) and the transmit coil 410.

According to an embodiment, a first temperature sensing unit 711 may be mounted at an upper side (e.g., a +Y-axis direction), a second temperature sensing unit 721 may be mounted at a right side (e.g., a −X-axis direction), a third temperature sensing unit 731 may be mounted at a lower side (e.g., a −Y-axis direction), and a fourth temperature sensing unit 741 may be mounted at a left side (e.g., a +X-axis direction), around the central portion 415 of the coil between the substrate 401 and the transmit coil 410. In this case, although metal foreign substances are spaced apart from the central portion of a wireless power transmission apparatus 101, heat generated by the metal foreign substances may be effectively detected.

For the first to fourth temperature sensing units 711, 721, 731, and 741 to reduce the amount of lost power and prevent the electronic device from being damaged, the first temperature sensing unit 711 may be mounted spaced apart from the central portion 415 of the coil to an upper side (e.g., a +Y-axis direction) between the substrate 401 and the transmit coil 410 by a specified distance, the third temperature sensing unit 731 may be mounted spaced apart from the central portion 415 of the coil to a lower side (e.g., a −Y-axis direction) by the specified distance, the fourth temperature sensing unit 741 may be mounted spaced apart from the central portion 415 of the coil to a left side (e.g., a +X-axis direction) by the specified distance, and the second temperature sensing unit 721 may be mounted spaced apart from the central portion 415 of the coil to a right side (e.g., a −X-axis direction) by the specified distance. According to an embodiment, the specified distance may be 5 mm~25 mm. For example, to improve power transmission efficiency, the specified distance may be 10.87 mm~20.87 mm. The first to fourth temperature sensing units 711, 721, 731, and 741 may be mounted at various positions between the substrate 401 and the transmit coil 410, and the positions where the first to fourth temperature sensing units 711, 721, 731, and 741 are mounted are not restricted or limited in the disclosure.

According to an embodiment, the ground wiring 650 may be wound around the central portion 415 of the coil from any point on the substrate 401 and may connect each of the first to fourth temperature sensing units 711, 721, 731, and 741. According to an embodiment, the ground wiring 650 may play a role in connecting the ground with the first to fourth temperature sensing units 711, 721, 731, and 741.

As the first to fourth wires 713, 723, 733, and 743 and the ground wiring 650 are influenced by a magnetic field generated by the transmit coil 410, current may be generated in the first to fourth wires 713, 723, 733, and 743 and the ground wiring 650, and heat by an internal resistance value of the wire and the wiring may be generated by the generated current. At this time, an influence by a magnetic field generated by the transmit coil 410 may be reduced using a magnetic field offset effect between a pattern of being wound from any point on the transmit coil 410 of the first to fourth wires 713, 723, 733, and 743 to a point where the first to fourth temperature sensing units 711, 721, 731, and 741 are located around the central portion 415 of the coil and being connected with the first to fourth temperature sensing units 711, 721, 731, and 741 and a pattern of being rewound in a direction opposite to the direction where the first to fourth wires 713, 723, 733, and 743 are wound around the central portion 415 of the coil from a point where the ground wiring 650 is connected with the first to fourth temperature sensing units 711, 721, 731, and 741.

Figure 8:
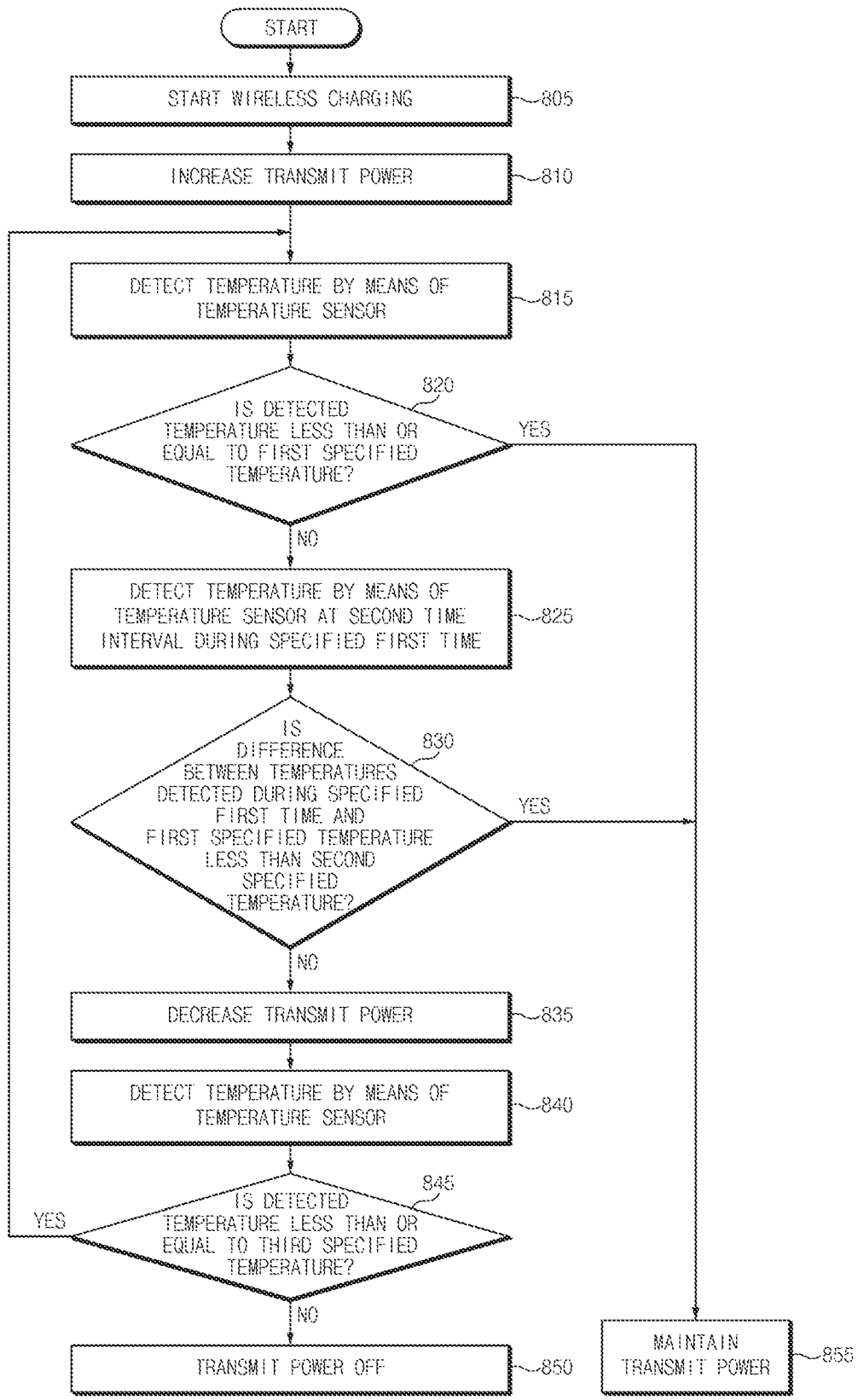
FIG. 8 is a flowchart illustrating an operation method of a wireless power transmission apparatus according to an embodiment of the disclosure.

FIG. 8 is a flowchart illustrating an operation method of a wireless power transmission apparatus according to an embodiment of the disclosure.

The embodiment shown in FIG. 8 is only one embodiment, and various embodiments disclosed in the disclosure are not limited to that shown in FIG. 8. For example, an operation order according to various embodiments disclosed in the disclosure may be different from that shown in FIG. 8, and some operations shown in FIG. 8 may be omitted.

Referring to FIG. 8, in operation 805, when a wireless power reception apparatus 195 is placed on a wireless power transmission apparatus 101, the wireless power transmission apparatus 101 may wirelessly transmit power to the wireless power reception apparatus 195 in an induction scheme or a resonant scheme to start wireless charging.

In operation 810, the wireless power transmission apparatus 101 may increase power transmitted to the wireless power reception apparatus 195. According to an embodiment, the wireless power transmission apparatus 101 may sequentially increase power transmitted over time by a predetermined degree.

In operation 815, the wireless power transmission apparatus 101 may detect a temperature by means of a temperature sensor mounted in the wireless power transmission apparatus 101. For example, the wireless power transmission apparatus 101 may detect a temperature by means of the temperature sensor in a specified period or a specified time.

In operation 820, the wireless power transmission apparatus 101 may determine whether the temperature detected in operation 815 is less than or equal to a first specified temperature. According to an embodiment, the first specified temperature may be a temperature which is 70% of the limit temperature (e.g., 70° C.) (e.g., the first specified temperature is 49° C. when the limit temperature is 70° C.). This operation may be performed by a control circuit (e.g., a control circuit 312 of FIG. 3) of the wireless power transmission apparatus 101 based on temperature information provided by a sensing circuit (e.g., a sensing circuit 314 of FIG. 3) of the wireless power transmission apparatus 101.

When the temperature detected in operation 815 is less than or equal to the first specified temperature, in operation 855, the wireless power transmission apparatus 101 may continue maintaining the transmitted power. According to an embodiment, the wireless power transmission apparatus 101 may perform operation 815 of detecting a temperature by means of the temperature sensor in the specified period or the specified time.

When the temperature detected in operation 815 is greater than the first specified temperature, in operation 825, the wireless power transmission apparatus 101 may detect a temperature by means of the temperature sensor mounted in the wireless power transmission apparatus 101 at a specified second time interval during the specified first time. According to an embodiment, the specified first time may be 2 seconds, and the specified second time may be 0.1 seconds.

In operation 830, the wireless power transmission apparatus 101 may determine whether a difference between the temperatures detected in operation 825 and the first specified temperature is less than or equal to a second specified temperature. According to an embodiment, the second specified temperature may be 3° C. This operation may be performed by the control circuit (e.g., the control circuit 312 of FIG. 3) of the wireless power transmission apparatus 101 based on temperature information provided by the sensing circuit (e.g., the sensing circuit 314 of FIG. 3) of the wireless power transmission apparatus 101.

When the difference between the temperatures detected in operation 825 and the first specified temperature is less than or equal to the second specified temperature, in operation 855, the wireless power transmission apparatus 101 may continue maintaining the transmitted power.

When the difference between the temperatures detected in operation 825 and the first specified temperature is greater than the second specified temperature, in operation 835, the wireless power transmission apparatus 101 may decrease the transmitted power by a predetermined degree.

In operation 840, the wireless power transmission apparatus 101 may detect a temperature by means of the temperature sensor mounted in the wireless power transmission apparatus 101. According to an embodiment, after decreasing the transmitted power by the predetermined degree in operation 835, when a specified time elapses, the wireless power transmission apparatus 101 may detect a temperature by means of the temperature sensor.

In operation 845, the wireless power transmission apparatus 101 may determine whether the temperature detected in operation 840 is less than or equal to a third specified temperature. According to an embodiment, the third specified temperature may be a temperature which is 90% of the limit temperature (e.g., 70° C.) (e.g., the third specified temperature is 63° C. when the limit temperature is 70° C.). This operation may be performed by the control circuit (e.g., the control circuit 312 of FIG. 3) of the wireless power transmission apparatus 101 based on temperature information provided by the sensing circuit (e.g., the sensing circuit 314 of FIG. 3) of the wireless power transmission apparatus 101.

When the temperature detected in operation 840 is less than or equal to the third specified temperature, the wireless power transmission apparatus 101 may perform the operation from operation 815 again by branching to operation 815.

When the temperature detected in operation 840 is greater than the third specified temperature, in operation 850, the wireless power transmission apparatus 101 may stop transmitting the wireless power.

Hereinafter, a description will be given of a method for adjusting wirelessly received power in a wireless power reception apparatus according to an embodiment with reference to FIGS. 9A and 9B.

Figure 9A:
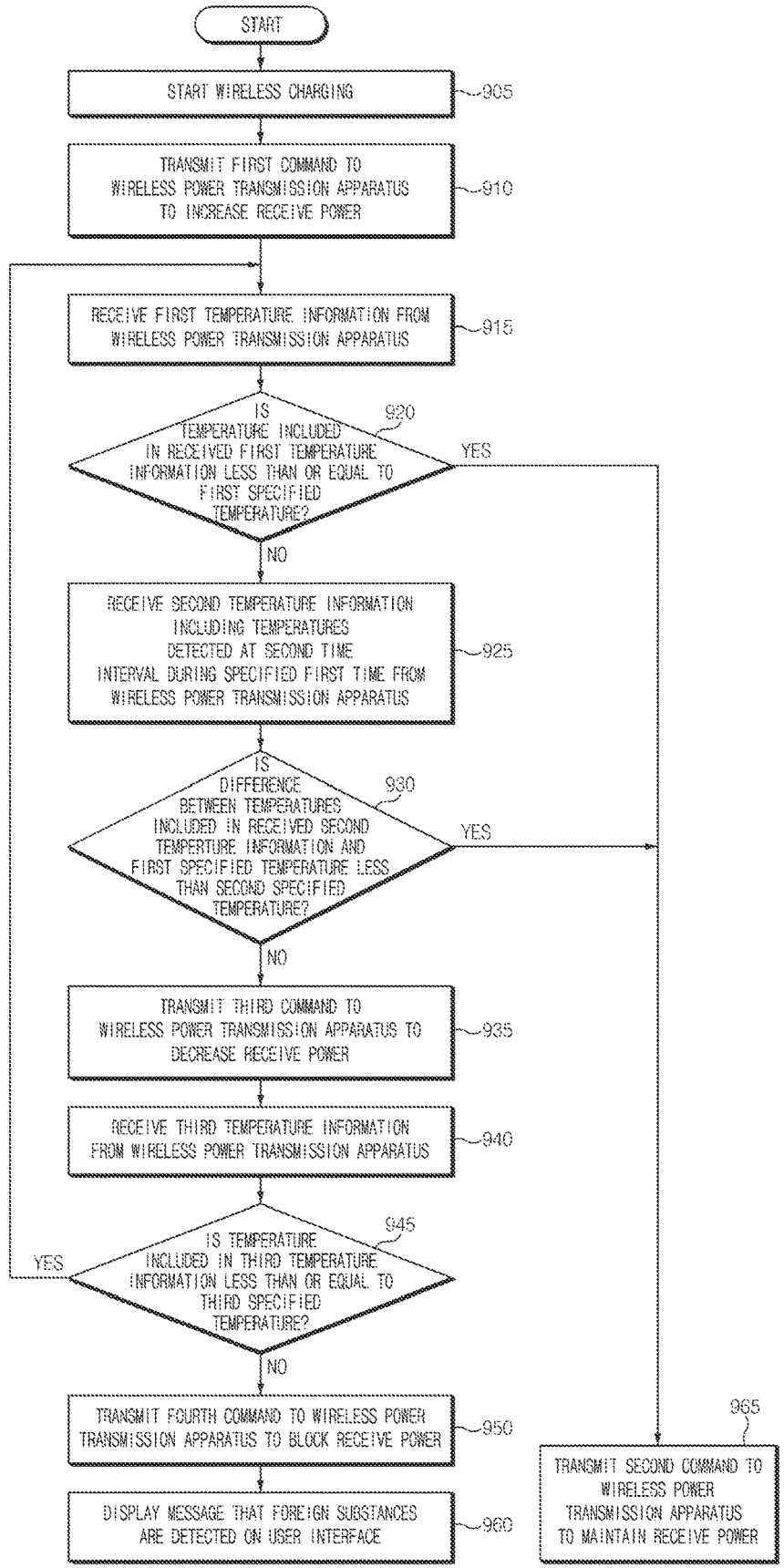
FIG. 9A is a flowchart illustrating an operation method of a wireless power reception apparatus according to an embodiment of the disclosure.

FIG. 9A is a flowchart illustrating an operation method of a wireless power reception apparatus according to an embodiment of the disclosure.

Figure 9B:
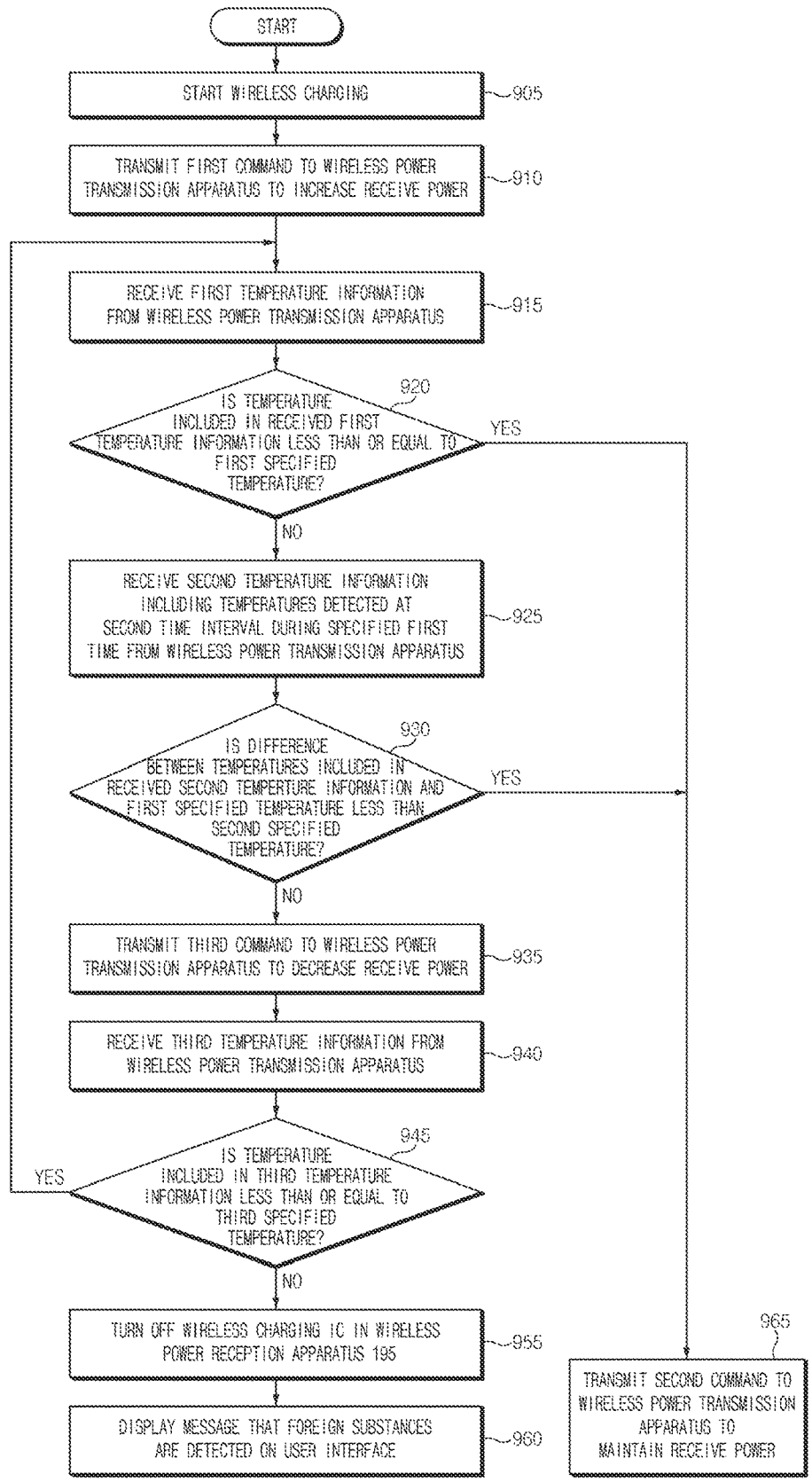
FIG. 9B is a flowchart illustrating an operation method of a wireless power reception apparatus according to an embodiment of the disclosure.

FIG. 9B is a flowchart illustrating an operation method of a wireless power reception apparatus according to an embodiment of the disclosure.

Referring to FIGS. 9A and 9B, in operation 905, when a wireless power reception apparatus 195 is placed on a wireless power transmission apparatus 101, it may wirelessly receive power from the wireless power transmission apparatus 101 in an induction scheme or a resonant scheme to start wireless charging.

In operation 910, the wireless power reception apparatus 195 may transmit a first command to the wireless power transmission apparatus 101 to increase a receive power. According to an embodiment, the first command may be a control error packet (CEP) for requesting to increase power to be transmitted. According to an embodiment, receiving the first command, the wireless power transmission apparatus 101 may sequentially increase power, transmitted over time, by a predetermined degree.

In operation 915, the wireless power reception apparatus 195 may receive first temperature information from the wireless power transmission apparatus 101. According to an embodiment, the first temperature information may be information about a temperature detected by means of a temperature sensor mounted in the wireless power transmission apparatus 101. According to an embodiment, the wireless power reception apparatus 195 may receive the first temperature information from the wireless power transmission apparatus 101 on a periodic basis or in a specified time. According to another embodiment, the wireless power reception apparatus 195 may receive the first temperature information from the wireless power transmission apparatus 101 based on requesting temperature information from the wireless power transmission apparatus 101 on a periodic basis or in a specified time.

In operation 920, the wireless power reception apparatus 195 may determine whether a temperature included in the received first temperature information is less than or equal to a first specified temperature. According to an embodiment, the first specified temperature may be a temperature which is 70% of the limit temperature (e.g., 70° C.) (e.g., the first specified temperature is 49° C. when the limit temperature is 70° C.). This operation may be performed by a control circuit (e.g., a control circuit 312 of FIG. 3) of the wireless power reception apparatus 195.

When the temperature included in the first temperature information is less than or equal to the first specified temperature, in operation 965, the wireless power reception apparatus 195 may transmit a second command to the wireless power transmission apparatus 101 to continue maintaining the receive power. According to an embodiment, the second command may be a control error packet (CEP) for requesting to maintain power to be transmitted. According to an embodiment, receiving the second command, the wireless power transmission apparatus 101 may maintain the transmitted power. According to an embodiment, the wireless power reception apparatus 195 may perform operation 915 of receiving the first temperature information from the wireless power transmission apparatus 101 on a periodic basis or in a specified time.

When the temperature included in the first temperature information is greater than the first specified temperature, in operation 925, the wireless power reception apparatus 195 may receive second temperature information from the wireless power transmission apparatus 101. According to an embodiment, the second temperature information may include information about temperatures detected by means of the temperature sensor mounted in the wireless power transmission apparatus 101 at a specified second time interval during a specified first time. According to an embodiment, the specified first time may be 2 seconds. According to an embodiment, the specified second time may be 0.1 seconds. According to an embodiment, the wireless power reception apparatus 195 may receive the second temperature information from the wireless power transmission apparatus 101 on a periodic basis or in a specified time. According to another embodiment, the wireless power reception apparatus 195 may receive the second temperature information from the wireless power transmission apparatus 101 based on requesting temperature information from the wireless power transmission apparatus 101 on a periodic basis or in a specified time.

In operation 930, the wireless power reception apparatus 195 may determine whether a difference between the temperatures included in the second temperature information and the first specified temperature is less than or equal to a second specified temperature. According to an embodiment, the second specified temperature may be 3° C. This operation may be performed by a control circuit (e.g., a control circuit 312 of FIG. 3) of the wireless power reception apparatus 195.

When the difference between the temperatures included in the second temperature information and the first specified temperature is less than or equal to the second specified temperature, in operation 965, the wireless power reception apparatus 195 may transmit a second command to the wireless power transmission apparatus 101 to continue maintaining the receive power. According to an embodiment, the second command may be a control error packet (CEP) for requesting to maintain power to be transmitted. According to an embodiment, receiving the second command, the wireless power transmission apparatus 101 may maintain the transmitted power.

When the difference between the temperatures included in the second temperature information and the first specified temperature is greater than the second specified temperature, in operation 935, the wireless power reception apparatus 195 may transmit a third command to the wireless power transmission apparatus 101 to decrease the receive power. According to an embodiment, the third command may be a control error packet (CEP) for requesting to decrease power to be transmitted. According to an embodiment, receiving the third command, the wireless power transmission apparatus 101 may decrease the transmitted power.

In operation 940, the wireless power reception apparatus 195 may receive third temperature information from the wireless power transmission apparatus 101. According to an embodiment, the third temperature information may be information about a temperature detected by means of a temperature sensor mounted in the wireless power transmission apparatus 101. According to an embodiment, when a specified time elapses after transmitting the third command to the wireless power transmission apparatus 101 to decrease the receive power in operation 935, the wireless power reception apparatus 195 may receive the third temperature information from the wireless power transmission apparatus 101. According to another embodiment, when the specified time elapses after transmitting the third command to the wireless power transmission apparatus 101 to decrease the receive power in operation 935, the wireless power reception apparatus 195 may receive the third temperature information from the wireless power transmission apparatus 101 based on requesting the third temperature information from the wireless power transmission apparatus 101.

In operation 945, the wireless power reception apparatus 195 may determine whether the temperature included in the third temperature information is less than or equal to a third specified temperature. According to an embodiment, the third specified temperature may be a temperature which is 90% of the limit temperature (e.g., 70° C.) (e.g., the third specified temperature is 63° C. when the limit temperature is 70° C.). This operation may be performed by the control circuit (e.g., the control circuit 312 of FIG. 3) of the wireless power reception apparatus 195.

When the temperature included in the third temperature information is less than or equal to the third specified temperature, in operation 915, the wireless power reception apparatus 195 may receive temperature information again from the wireless power transmission apparatus 101.

According to an embodiment, when the temperature included in the third temperature information is greater than the third specified temperature, referring to FIG. 9A, in operation 950, the wireless power reception apparatus 195 may transmit a fourth command to the wireless power transmission apparatus 101 to block the receive power. According to an embodiment, the fourth command may be a packet for requesting to stop power transmission. According to an embodiment, receiving the fourth command, the wireless power transmission apparatus 101 may stop transmitting the wireless power.

According to an embodiment, when the temperature included in the third temperature information is greater than the third specified temperature, referring to FIG. 9B, in operation 955, the wireless power reception apparatus 195 may turn off a wireless charging IC mounted in the wireless power reception apparatus 195. In this case, when there is no periodic information transmission from the wireless power reception apparatus 195, the wireless power transmission apparatus 101 may determine that the wireless power reception apparatus 195 is not placed on the wireless power transmission apparatus 101 to stop transmitting the wireless power.

Referring again to FIGS. 9A and 9B, in operation 960, the wireless power reception apparatus 195 may provide a user with information that foreign substances are detected on the wireless power transmission apparatus 101. For example, the wireless power reception apparatus may display a message on a display (e.g., a display 325 of FIG. 3), provide a sound through a sound output module (e.g., a sound output module 1055 of FIG. 10), or provide a notification through a haptic module (e.g., a haptic module 1079 of FIG. 10).

Figure 10:
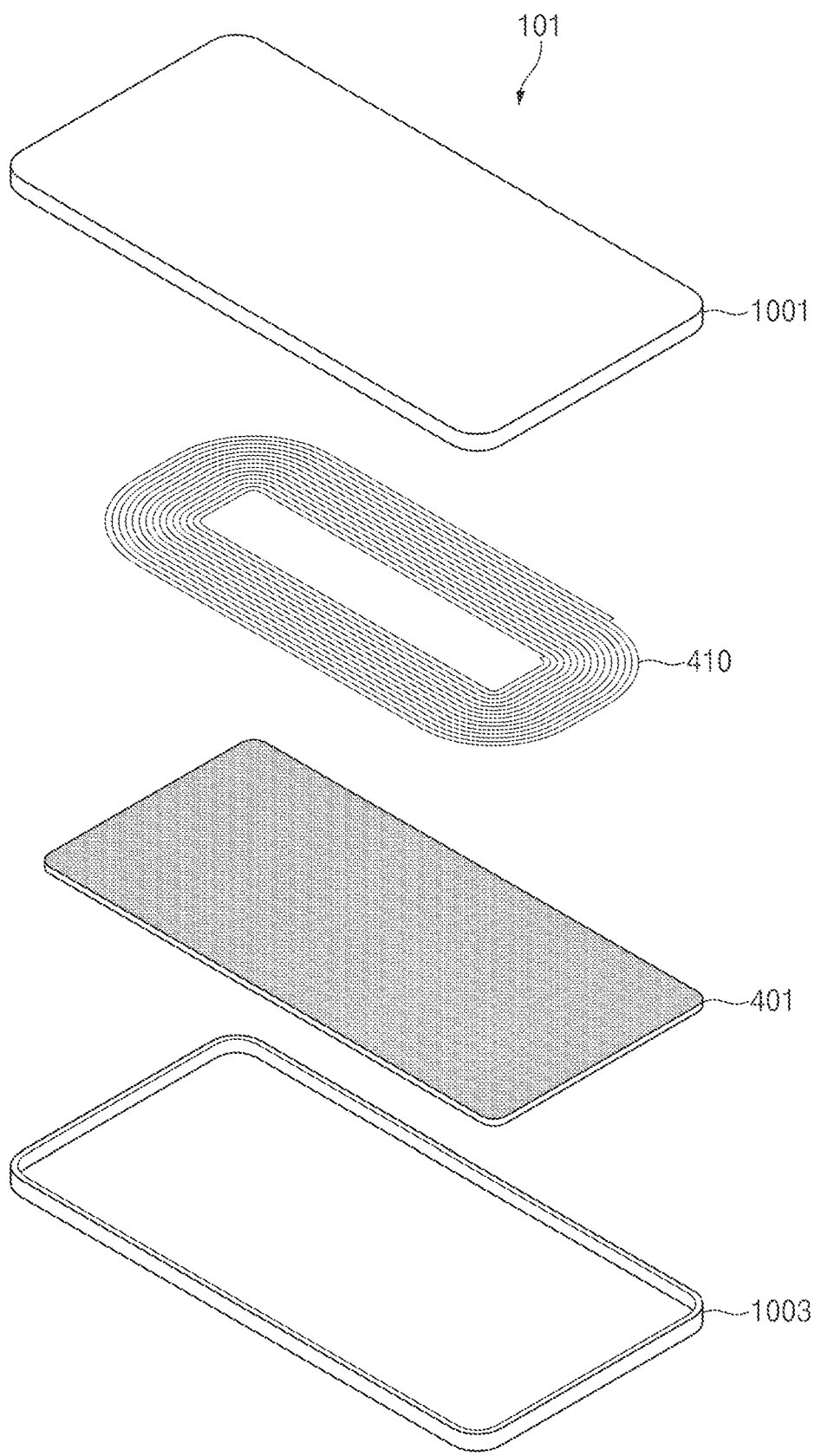
FIG. 10 is an exploded perspective view illustrating a configuration of a wireless power transmission apparatus according to an embodiment of the disclosure.

FIG. 10 is an exploded perspective view illustrating a configuration of a wireless power transmission apparatus according to an embodiment of the disclosure.

Referring to FIG. 10, a wireless power transmission apparatus 101 may include an upper housing 1001, a lower housing 1003 capable of being coupled to the upper housing 1001, a transmit coil 410, and/or a substrate 401 and may be disposed in a manner where the substrate 401 and the transmit coil 410 are sequentially laminated at an inner side of the upper housing 1001 and the lower housing 1003.

According to an embodiment, the substrate 401 may mount components of the wireless power transmission apparatus 101, for example, a power transmission circuit (e.g., a power transmission circuit 311 of FIG. 3), a control circuit (e.g., a control circuit 312 of FIG. 3), a communication circuit (e.g., a communication circuit 313 of FIG. 3), and/or a sensing circuit (e.g., a sensing circuit 314 of FIG. 3). The substrate 401 may be implemented using at least one of a printed circuit board (PCB) or a flexible printed circuit board (FPCB). According to an embodiment, the substrate 401 may operate as a ground plate. The substrate 401 may be implemented as various types and structures, and the type and structure of the substrate 401 are not restricted or limited in the disclosure.

According to an embodiment, the transmit coil 410 may be formed by being wound in the form of rotating for wireless charging. According to an embodiment, the transmit coil 410 may be disposed between the upper housing 1001 and the substrate 401. According to an embodiment, when a transmit power output from a matching circuit (e.g., a matching circuit 311c of FIG. 3) is supplied, the transmit coil 410 may wirelessly transmit the supplied transmit power. The transmit coil 410 may transmit power in a magnetic induction scheme, a magnetic resonance scheme, or a microwave scheme. The transmit coil 410 may be implemented as a circle with an empty center, an oval, a quadrangle, or a quadrangle with rounded corners. The transmit coil 410 may be implemented as various shapes and structures, and the shape, structure, and number of the transmit coil 410 are not restricted or limited in the disclosure.

According to an embodiment, at least one temperature sensor (not shown) may be included in an inner side of the upper housing 1001 and the lower housing 1003. According to an embodiment, the at least one temperature sensor (not shown) may be disposed between the upper housing 1001 and the transmit coil 410. According to an embodiment, the at least one temperature sensor (not shown) may be disposed between the transmit coil 410 and the substrate 401. The at least one temperature sensor (not shown) may be resistance temperature detectors (RTD), a negative temperature coefficient (NTC) thermistor, a positive temperature coefficient (PTC) thermistor, or a thermocouple. According to an embodiment, the at least one temperature sensor (not shown) may be implemented to sense heat generated by metal foreign substances present on the wireless power transmission apparatus 101 during wireless charging. According to an embodiment, the at least one temperature sensor (not shown) may be implemented to provide the control circuit (e.g., the control circuit 312 of FIG. 3) with temperature information sensed to determine whether foreign substances are present. The at least one temperature sensor (not shown) may include various means capable of detecting a temperature, and the mounting position and number of the at least one temperature sensor (not shown) are restricted or limited in the disclosure.

Figure 11:
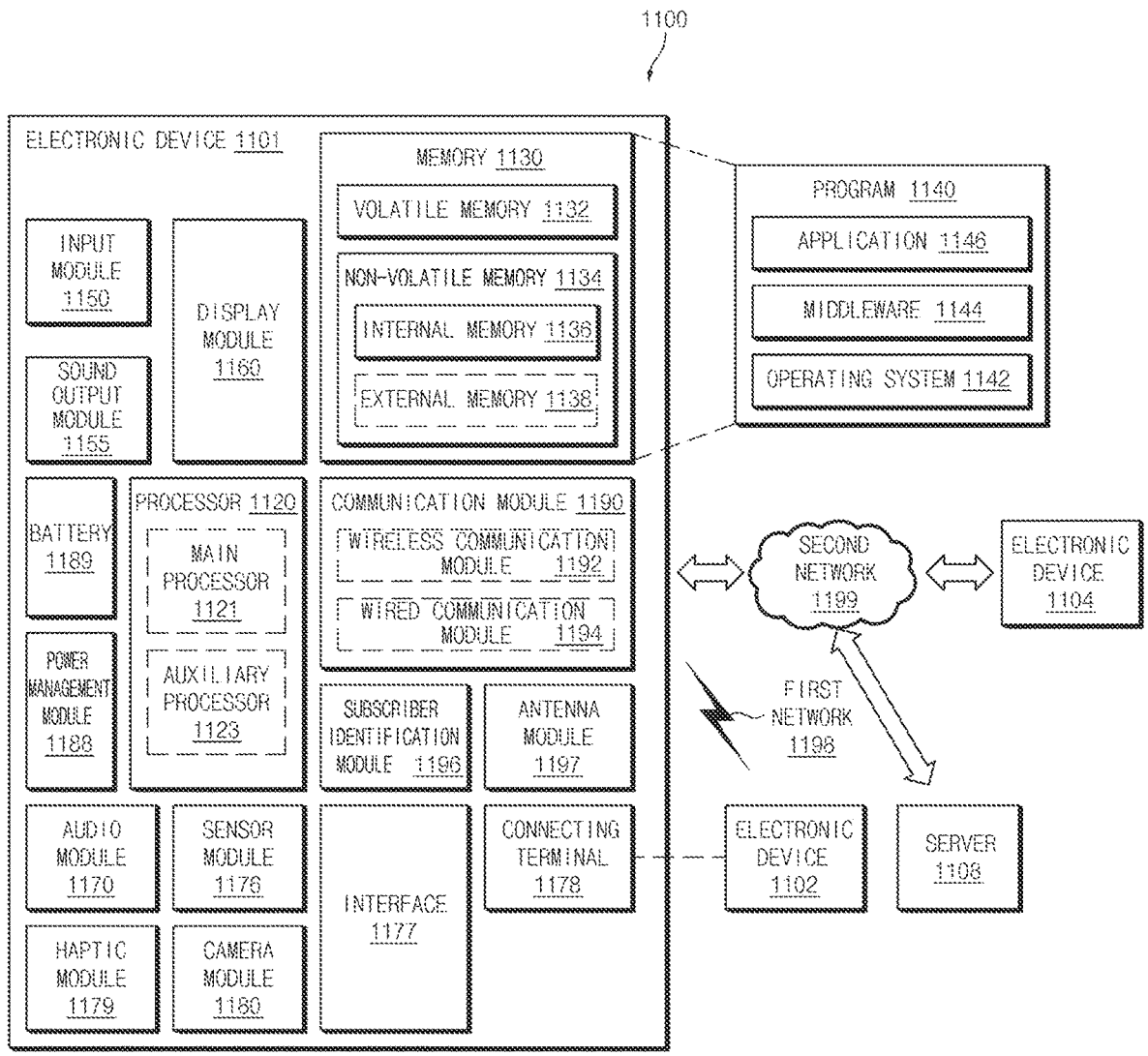
FIG. 11 is a block diagram illustrating a wireless power reception apparatus in a network environment according to an embodiment of the disclosure.

FIG. 11 is a block diagram illustrating a wireless power reception apparatus in a network environment according to an embodiments of the disclosure.

FIG. 11 is a block diagram illustrating an electronic device 1101 in a network environment 1100 according to an embodiment of the disclosure.

Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In some embodiments, at least one of the components (e.g., the connecting terminal 1178) may be omitted from the electronic device 1101, or one or more other components may be added in the electronic device 1101. In some embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™ wireless-fidelity (Wi-Fi) direct, or infrared data association (IrDA)) or the second network 1199 (e.g., a long-range communication network, such as a legacy cellular network, a fifth generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In another embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of the expressions "A or B," "at least one of A and B," "at least one of A or B," "A, B, or C," "at least one of A, B, and C," and "at least one of A, B, or C," may include any and all combinations of one or more of the items listed together with a corresponding expression among the expressions. Such terms as "1st" and "2nd," or "first" and "second" may be used to simply distinguish a corresponding component from another, and does not limit the components in other aspect (e.g., importance or order). It is to be understood that if any (e.g., a first) component is referred to, with or without the term "operatively" or "communicatively", as "coupled with," "coupled to," "connected with," or "connected to" another (e.g., a second) component, it means that the element may be coupled with the other element directly (e.g., wiredly), wirelessly, or via a third component.

As used herein, the term "module" used in various embodiments of the disclosure may include a unit implemented in hardware, software, or firmware, and may be interchangeably used with other terms, such as "logic," "logic block," "part," or "circuitry". A module may be an integral part, or a minimum unit or portion thereof, adapted to perform one or more functions. For example, according to an embodiment, the module may be implemented in a form of an application-specific integrated circuit (ASIC).

Various embodiments of the disclosure may be implemented as software (e.g., a program) including one or more instructions stored in a storage medium (e.g., an internal memory 1136 or an external memory 1138) readable by a machine (e.g., an electronic device). For example, a processor (e.g., a processor 120) of a machine (e.g., an electronic device such as wireless power transmission apparatus 101) may invoke at least one instruction among one or more stored instructions from the storage medium and may execute it. A memory (e.g., a memory 130 of FIG. 1) of the electronic device 1101 may store attribute (e.g., cluster grade) information of a cluster in which the electronic device 100 is participating or may store attribute information of an external cluster, which is received from the external cluster. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Here, the term "non-transitory" simply means that the storage medium is a tangible device and does not include a signal (e.g., an electromagnetic wave), but this term does not differentiate between where data is semi-permanently stored in the storage medium and where data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

A wireless power transmission apparatus 101 according to an embodiment disclosed in the disclosure may include an upper housing 1001, a lower housing 1003 coupled to the upper housing 1001, a substrate 401 disposed between the upper housing 1001 and the lower housing 1003, a transmit coil 410 disposed between the upper housing 1001 and the substrate 401 and formed by being wound in the form of rotating on the substrate 401, at least one temperature sensor 520 including a pattern resistor 525, a resistance numerical value of which varies with a temperature, and a flexible printed circuit board (FPCB) 510 on which the at least one temperature sensor 520 is disposed. The pattern resistor 525 may be disposed on the FPCB 510 in a pattern of being wound in a first direction from any first point on the FPCB 510 to any second point different from the any first point on the FPCB 510 around a central portion of the FPCB 510 and being rewound in a second direction opposite to the first direction.

According to an embodiment disclosed in the disclosure, the pattern resistor 525 may be disposed on the FPCB 510 in a pattern of winding one turn in the first direction around the central portion of the FPCB 510 from the any first point on the FPCB 510 and rewinding one turn in the second direction opposite to the first direction.

According to an embodiment disclosed in the disclosure, the at least one temperature sensor 520 may be disposed between the upper housing 1001 and the transmit coil 410.

According to an embodiment disclosed in the disclosure, the FPCB 510 may be disposed between the at least one temperature sensor 520 and the transmit coil 410.

According to an embodiment disclosed in the disclosure, the at least one temperature sensor 520 may be disposed between the transmit coil 410 and the substrate 401.

According to an embodiment disclosed in the disclosure, the FPCB 510 may be disposed between the at least one temperature sensor 520 and the substrate 401.

According to an embodiment disclosed in the disclosure, the pattern resistor 525 may be spaced apart from the central portion of the FPCB 510 by a specified distance.

A wireless power transmission apparatus according to an embodiment disclosed in the disclosure may include an upper housing 1001, a lower housing 1003 coupled to the upper housing 1001, a substrate 401 disposed between the upper housing 1001 and the lower housing 1003, a transmit coil 410 disposed between the upper housing 1001 and the substrate 401 and formed by being wound in the form of rotating the substrate 401, at least one temperature sensor 601, 603, 605, and/or 607 corresponding to any one of a negative temperature coefficient (NTC) thermistor, a positive temperature coefficient (PTC) thermistor, and a thermocouple, at least one wiring conductor 610, 620, 630, and/or 640 connected with the at least one temperature sensor 601, 603, 605, and/or 607, ground wiring 650 connected with the at least one temperature sensor 601, 603, 605, and/or 607 to ground the at least one temperature sensor 601, 603, 605, and/or 607, and a flexible printed circuit board (FPCB) 510 on which the at least one temperature sensor 601, 603, 605, and/or 607, the at least one wiring conductor 610, 620, 630, and/or 640, and the ground wiring 650 are arranged. The at least one wiring conductor 610, 620, 630, and/or 640 may be disposed on the FPCB 510 in a pattern of being wound in a first direction from any point on the FPCB 510 to a point where the at least one temperature sensor 601, 603, 605, and/or 607 is located around a central portion of the FPCB 510 and being connected with the at least one temperature sensor 601, 603, 605, and/or 607. The ground wiring 650 may be disposed on the FPCB 510 in a pattern of being rewound in a second direction opposite to the first direction around the central portion of the FPCB from a point connected with the at least one temperature sensor 601, 603, 605, and/or 607 on the FPCB 510.

According to an embodiment disclosed in the disclosure, the at least one temperature sensor 601, 603, 605, and/or 607, the at least one wiring conductor 610, 620, 630, and/or 640, and the ground wiring 650 may be arranged between the upper housing 1001 and the transmit coil 410.

According to an embodiment disclosed in the disclosure, the FPCB 510 may be disposed between the at least one temperature sensor 601, 603, 605, and/or 607 and the transmit coil 410.

According to an embodiment disclosed in the disclosure, the at least one temperature sensor 601, 603, 605, and/or 607, the at least one wiring conductor 610, 620, 630, and/or 640, and the ground wiring 650 may be arranged between the transmit coil 410 and the substrate 401.

According to an embodiment disclosed in the disclosure, the FPCB 510 may be disposed between the at least one temperature sensor 601, 603, 605, and/or 607 and the substrate 401.

According to an embodiment disclosed in the disclosure, the at least one temperature sensor 601, 603, 605, and/or 607 may be spaced apart from the central portion of the FPCB 510 by a specified distance.

According to an embodiment disclosed in the disclosure, the at least one temperature sensor 601, 603, 605, and/or 607 may be disposed at least one by one at at least one of an upper side and a lower side around the central portion of the FPCB 510 on the FPCB 510.

According to an embodiment disclosed in the disclosure, the at least one temperature sensor 601, 603, 605, and/or 607 may be disposed at least one by one at at least one of a left side and a right side around the central portion of the FPCB 510 on the FPCB 510.

A wireless power transmission apparatus according to an embodiment disclosed in the disclosure may include an upper housing 1001, a lower housing 1003 coupled to the upper housing 1001, a substrate 401 disposed between the upper housing 1001 and the lower housing 1003, a transmit coil 410 disposed between the upper housing 1001 and the substrate 401 and formed by being wound in the form of rotating on the substrate 401, at least one temperature sensor 710, 720, 730, and/or 740 which corresponds to any one of a wire type negative temperature coefficient (NTC) thermistor, a wire type positive temperature coefficient (PTC) thermistor, and a wire type thermocouple, includes a temperature sensing unit 711, 721, 731, and/or 741 and a wire 713, 723, 733, and/or 743 connected with the temperature sensing unit 711, 721, 731, and/or 741, and is disposed on the transmit coil 410, and a ground wiring 650 which is wound from any point on the transmit coil 410 to the point where the temperature sensing unit 711, 721, 731, and/or 741 of the at least one temperature sensor 710, 720, 730, and/or 740 is located around a central portion 415 of the transmit coil 410 and is connected with the temperature sensing unit 711, 721, 731, and/or 741 to ground the temperature sensing unit 711, 721, 731, and/or 741. The wire 713, 723, 733, and/or 743 of the at least one temperature sensor 710, 720, 730, and/or 740 may be disposed on the transmit coil 410 in a pattern of being wound from the any point on the transmit coil 410 to the point where the temperature sensing unit 711, 721, 731, and/or 741 of the at least one temperature sensor 710, 720, 730, and/or 740 is located around the central portion 415 of the transmit coil 410 and being connected with the temperature sensing unit 711, 721, 731, and/or 741.

According to an embodiment disclosed in the disclosure, the at least one temperature sensor 710, 720, 730, and/or 740 may be disposed between the upper housing 1001 and the transmit coil 410.

According to an embodiment disclosed in the disclosure, the at least one temperature sensor 710, 720, 730, and/or 740 may be disposed between the transmit coil 410 and the substrate 401.

According to an embodiment disclosed in the disclosure, the temperature sensing unit 711, 721, 731, and/or 741 of the at least one temperature sensor 710, 720, 730, and/or 740 may be disposed at least one by one at at least one of an upper side, a lower side, a left side, and a right side around the central portion 415 of the transmit coil 410 on the transmit coil 410.

According to an embodiment disclosed in the disclosure, the temperature sensing unit 711, 721, 731, and/or 741 of the at least one temperature sensor 710, 720, 730, and/or 740 may be spaced apart from the central portion 415 of the transmit coil 410 by a specified distance.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A wireless power transmission apparatus, comprising:
   an upper housing;
   a lower housing coupled to the upper housing;
   a substrate disposed between the upper housing and the lower housing;
   a transmit coil disposed between the upper housing and the substrate and formed by being wound in a form of rotating on the substrate;
   at least one temperature sensor including a pattern resistor, a resistance numerical value of which varies with a temperature; and
   a flexible printed circuit board (FPCB) on which the at least one temperature sensor is disposed,
   wherein the pattern resistor is disposed on the FPCB in a pattern of being wound in a first direction from any first point on the FPCB to any second point different from the any first point on the FPCB around a central portion of the FPCB and being rewound in a second direction opposite to the first direction.

2. The wireless power transmission apparatus of claim 1, wherein the pattern resistor is disposed on the FPCB in a pattern of winding one turn in the first direction around the central portion of the FPCB from the any first point on the FPCB and rewinding one turn in the second direction opposite to the first direction.

3. The wireless power transmission apparatus of claim 1, wherein the at least one temperature sensor is disposed between the upper housing and the transmit coil.

4. The wireless power transmission apparatus of claim 3, wherein the FPCB is disposed between the at least one temperature sensor and the transmit coil.

5. The wireless power transmission apparatus of claim 1, wherein the at least one temperature sensor is disposed between the transmit coil and the substrate.

6. The wireless power transmission apparatus of claim 5, wherein the FPCB is disposed between the at least one temperature sensor and the substrate.

7. The wireless power transmission apparatus of claim 1, wherein the pattern resistor is spaced apart from the central portion of the FPCB by a specified distance.

8. A wireless power transmission apparatus, comprising:
   an upper housing;
   a lower housing coupled to the upper housing;
   a substrate disposed between the upper housing and the lower housing;
   a transmit coil disposed between the upper housing and the substrate and formed by being wound in a form of rotating on the substrate;
   at least one temperature sensor corresponding to any one of a negative temperature coefficient (NTC) thermistor, a positive temperature coefficient (PTC) thermistor, or a thermocouple;
   at least one wiring conductor connected with the at least one temperature sensor;
   ground wiring connected with the at least one temperature sensor to ground the at least one temperature sensor; and
   a flexible printed circuit board (FPCB) on which the at least one temperature sensor, the at least one wiring conductor, and the ground wiring are arranged,
   wherein the at least one wiring conductor is disposed on the FPCB in a pattern of being wound in a first direction from any point on the FPCB to a point where the at least one temperature sensor is located around a central portion of the FPCB and being connected with the at least one temperature sensor, and
   wherein the ground wiring is disposed on the FPCB in a pattern of being rewound in a second direction opposite to the first direction around the central portion of the FPCB from a point connected with the at least one temperature sensor on the FPCB.

9. The wireless power transmission apparatus of claim 8, wherein the at least one temperature sensor, the at least one wiring conductor, and the ground wring are arranged between the upper housing and the transmit coil.

10. The wireless power transmission apparatus of claim 9, wherein the FPCB is disposed between the at least one temperature sensor and the transmit coil.

11. The wireless power transmission apparatus of claim 8, wherein the at least one temperature sensor, the at least one wiring conductor, and the ground wring are arranged between the transmit coil and the substrate.

12. The wireless power transmission apparatus of claim 11, wherein the FPCB is disposed between the at least one temperature sensor and the substrate.

13. The wireless power transmission apparatus of claim 8, wherein the at least one temperature sensor is spaced apart from the central portion of the FPCB by a specified distance.

14. The wireless power transmission apparatus of claim 8, wherein the at least one temperature sensor is disposed at least one by one at at least one of an upper side or a lower side around the central portion of the FPCB on the FPCB.

15. The wireless power transmission apparatus of claim 8, wherein the at least one temperature sensor is disposed at least one by one at at least one of a left side or a right side around the central portion of the FPCB on the FPCB.

16. A wireless power transmission apparatus, comprising:
   an upper housing;
   a lower housing coupled to the upper housing;
   a substrate disposed between the upper housing and the lower housing;
   a transmit coil disposed between the upper housing and the substrate and formed by being wound in a form of rotating on the substrate;
   at least one temperature sensor configured to:
      correspond to any one of a wire type negative temperature coefficient (NTC) thermistor, a wire type positive temperature coefficient (PTC) thermistor, or a wire type thermocouple,
      include a temperature sensing unit and a wire connected with the temperature sensing unit, and
      be disposed on the transmit coil; and
   ground wiring disposed on the transmit coil, wound from any point on the transmit coil to a point where the temperature sensing unit of the at least one temperature sensor is located around a central portion of the transmit coil, and connected with the temperature sensing unit to ground the temperature sensing unit, wherein the wire of the at least one temperature sensor is disposed on the transmit coil in a pattern of being wound from any point on the transmit coil to the point where the temperature sensing unit of the at least one temperature sensor is located around the central portion of the transmit coil and being connected with the temperature sensing unit.

17. The wireless power transmission apparatus of claim 16, wherein the at least one temperature sensor is disposed between the upper housing and the transmit coil.

18. The wireless power transmission apparatus of claim 16, wherein the at least one temperature sensor is disposed between the transmit coil and the substrate.

19. The wireless power transmission apparatus of claim 16, wherein the temperature sensing unit of the at least one temperature sensor is disposed at least one by one at one of an upper side, a lower side, a left side, or a right side around the central portion of the transmit coil on the transmit coil.

20. The wireless power transmission apparatus of claim 16, wherein the temperature sensing unit of the at least one temperature sensor is spaced apart from the central portion of the transmit coil by a specified distance.

* * * * *